United States Patent
Huang et al.

(10) Patent No.: US 10,833,283 B2
(45) Date of Patent: Nov. 10, 2020

(54) INSULATING TUNNELING CONTACT FOR EFFICIENT AND STABLE PEROVSKITE SOLAR CELLS

(71) Applicant: NUtech Ventures, Lincoln, NE (US)

(72) Inventors: Jinsong Huang, Lincoln, NE (US); Xiaopeng Zheng, Lincoln, NE (US); Qi Wang, Lincoln, NE (US); Yang Bai, Lincoln, NE (US); Qingfeng Dong, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

(21) Appl. No.: 16/130,797

(22) Filed: Sep. 13, 2018

(65) Prior Publication Data

US 2019/0097144 A1  Mar. 28, 2019

Related U.S. Application Data

(63) Continuation of application No. PCT/US2017/022473, filed on Mar. 15, 2017.

(60) Provisional application No. 62/308,750, filed on Mar. 15, 2016.

(51) Int. Cl.
*H01L 51/00* (2006.01)
*H01L 51/42* (2006.01)
*H01L 51/44* (2006.01)

(52) U.S. Cl.
CPC ...... *H01L 51/0091* (2013.01); *H01L 51/0034* (2013.01); *H01L 51/0047* (2013.01); *H01L 51/4246* (2013.01); *H01L 51/4286* (2013.01); *H01L 51/442* (2013.01); *H01L 51/0046* (2013.01); *H01L 2251/308* (2013.01); *Y02E 10/549* (2013.01)

(58) Field of Classification Search
None
See application file for complete search history.

(56) References Cited

U.S. PATENT DOCUMENTS

| | | |
|---|---|---|
| 9,082,992 B2 | 7/2015 | Guo et al. |
| 9,391,287 B1 | 7/2016 | Huang et al. |
| 9,583,724 B2 | 2/2017 | Huang et al. |
| 9,812,660 B2 | 11/2017 | Huang et al. |

(Continued)

FOREIGN PATENT DOCUMENTS

| | | |
|---|---|---|
| WO | WO 2013/171518 A1 | 11/2013 |
| WO | WO 2013/171520 A1 | 11/2013 |

(Continued)

OTHER PUBLICATIONS

Chao et al. ("A crosslinked fullerene matrix doped with an ionic fullerene as a cathodic buffer layer toward high performance and thermally stable polymer and organic metallohalide perovskite solar cells" J. Mater. Chem. A, 2015, 3, 20382 (Year: 2015).*

(Continued)

*Primary Examiner* — Magali P Slawski
(74) *Attorney, Agent, or Firm* — Leydig, Voit & Mayer, Ltd.; Gerald T. Gray

(57) ABSTRACT

Perovskite-based photoactive devices, such as solar cells, include an insulating tunneling layer inserted between the perovskite photoactive material and the electron collection layer to reduce charge recombination and concomitantly provide water resistant properties to the device.

30 Claims, 18 Drawing Sheets

(56) References Cited

U.S. PATENT DOCUMENTS

| | | | | |
|---|---|---|---|---|
| 2014/0183432 | A1* | 7/2014 | Barabash | H01L 45/08 |
| | | | | 257/2 |
| 2015/0200377 | A1 | 7/2015 | Etgar et al. | |
| 2015/0249170 | A1 | 9/2015 | Snaith et al. | |
| 2015/0340632 | A1* | 11/2015 | Etgar | H01L 51/4226 |
| | | | | 136/255 |
| 2017/0200526 | A1* | 7/2017 | Guo | H01B 1/02 |
| 2018/0358571 | A1* | 12/2018 | Choi | H01L 51/442 |
| 2019/0257742 | A1* | 8/2019 | Scheeline | G01J 3/18 |

FOREIGN PATENT DOCUMENTS

| | | | |
|---|---|---|---|
| WO | WO 2014/210040 A1 | 12/2014 | |
| WO | WO 2015/183563 A1 | 12/2015 | |
| WO | WO 2015/189551 A1 | 12/2015 | |
| WO | WO-2015189551 A1 * | 12/2015 | |

OTHER PUBLICATIONS

Luo, Shiqiang, et al., "Recent progress in organic-inorganic halide perovskite solar cells: mechanisms and material design," J. Mater. Chem. A, 2015, 3, 8992-9010, Royal Society of Chemistry.

Shi, Dong, et al., "Low trap-state density and long carrier diffusion in organolead trihalide perovskite single crystals," sciencemag.org, Jan. 30, 2015, vol. 347, issue 6221, pp. 519-522.

Wang, Qi, et al., "Thin Insulating Tunneling Contacts for Efficient and Water-Resistant Perovskite Solar Cells," Dept. of Mechanical and Materials Engineering, and Department of Physics and Astronomy, University of Nebraska-Lincoln, pp. 1-28.

Yakunin, S., et al., "Detection of X-ray photons by solution-processed lead halide perovskites," Institute of Semiconductor and Solid State Physics, University Linz, Altenbergerstrabe 69, Linz 4040 Austria, pp. 1-18.

Yue, Yougeng., et al., "Selective Deposition of Insulating Metal Oxide in Perovskite Solar Cells with Enhanced Device Performance," ChemSusChem 2015, 8, 2625-2629, Wiley-VCH Verlag GmbH & Co. KGaA, Weinheim.

Bai, Yang, et al., "Enhancing stability and efficiency of perovskite solar cells with crosslinkable silane-functionalized and doped fullerene," Nature Communications, 7:12806 DOI: 10.1038, ncomms12806, www.nature.com, pp. 1-9, Department of Mechanical and Materials Engineering, College of Engineering, University of Nebraska, Lincoln, Nebraska.

Chao, Yi-Hsiang, et al., "A crosslinked fullerene matrix doped with an ionic fullerene as a cathodic buffer layer toward high-performance and thermally stable polymer and organic metal-lohalide perovskite solar cells," J.Mater.Chem.A., 2015, 3, 20382-20388, The Royal Society of Chemistry.

Written Opinion of the International Searching Authority, dated Jun. 9, 2017, in Application No. PCT/US2017/022473.

International Search Report, dated Jun. 9, 2017, in Application No. PCT/US2017/022473.

Kim, H., et al., "Lead Iodide Perovskite Sensitized All-Solid-State Submicron Thin Film Mesoscopic Solar Cell With Efficiency Exceeing 9%," Scientific Reports 2, 591; DOI:10.1038/srep00591 (2012).

* cited by examiner

FIG. 1A
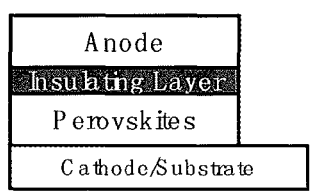
FIG. 1B
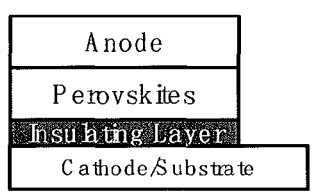
FIG. 1C
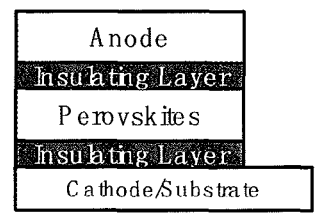
FIG. 1D
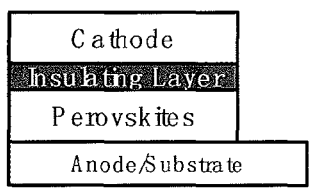
FIG. 1E
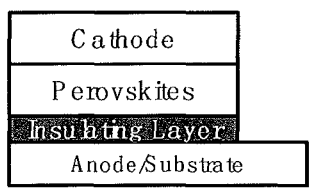
FIG. 1F
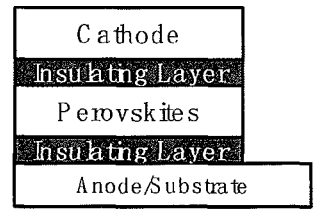
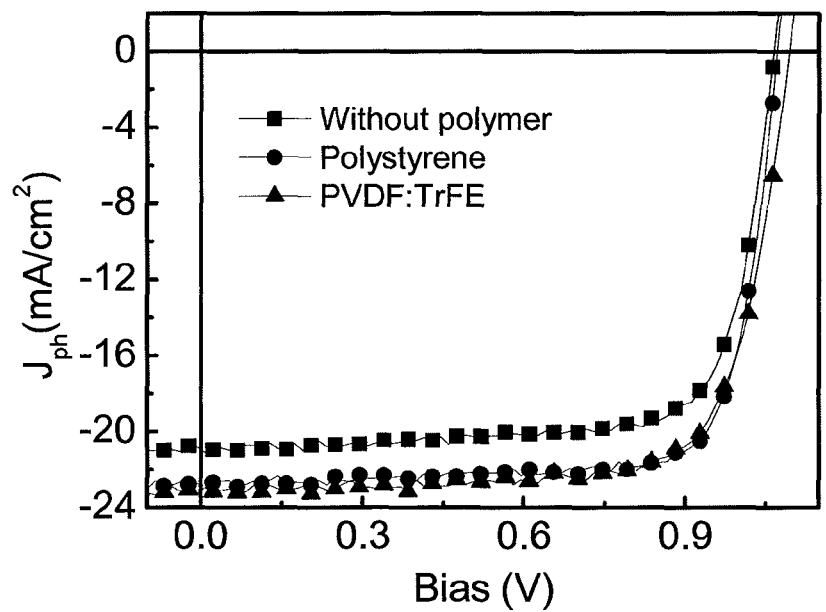
FIG. 2

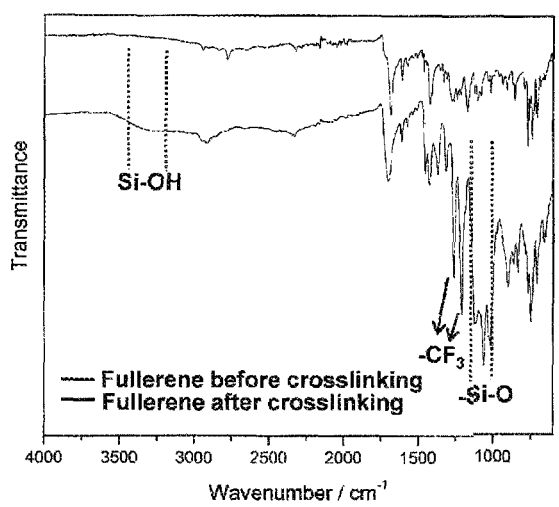
FIG. 15A
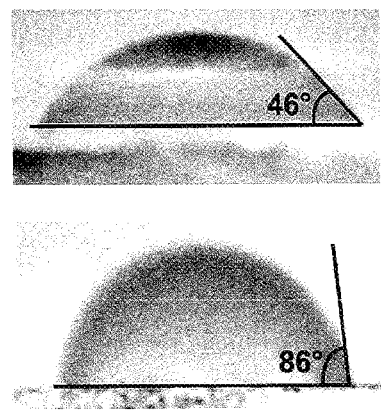
FIG. 15B
FIG. 15C

FIG. 19
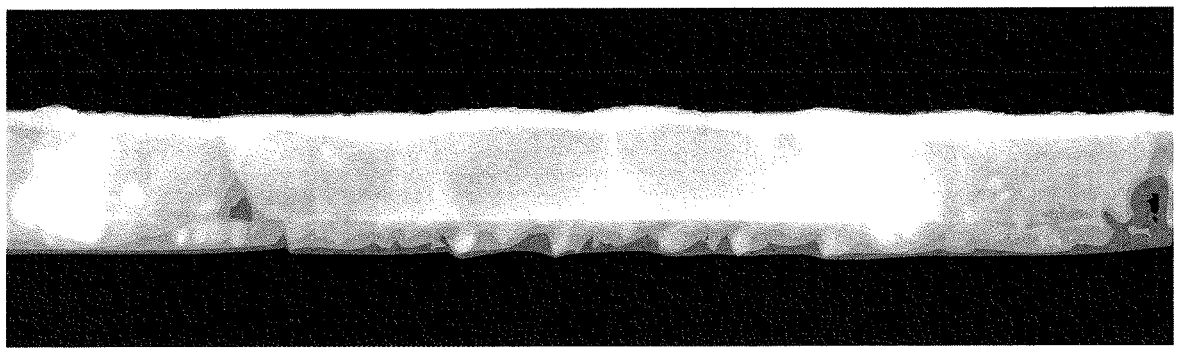
FIG. 20A
FIG. 20B
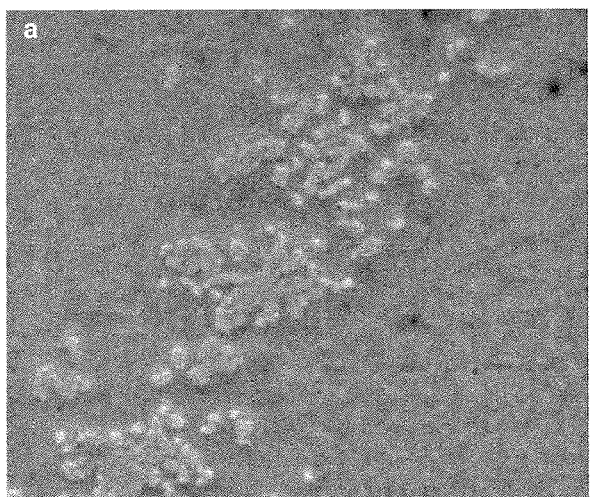 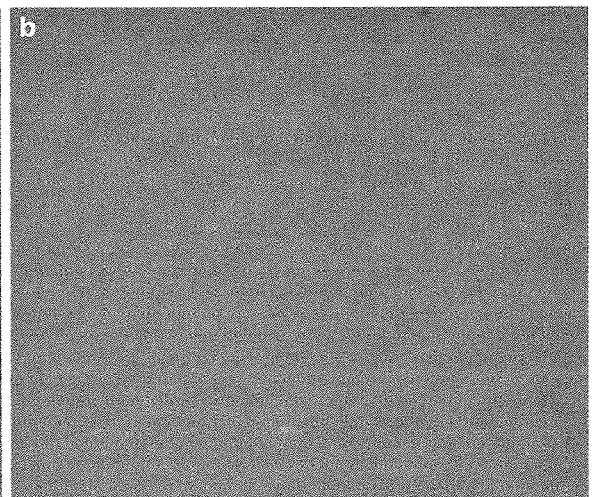

US 10,833,283 B2

INSULATING TUNNELING CONTACT FOR EFFICIENT AND STABLE PEROVSKITE SOLAR CELLS

CROSS REFERENCES

The present Application for Patent claims priority to International Patent Application No. PCT/US2017/022473 by Huang et al., entitled "Insulating Tunneling Contact for Efficient and Stable Perovskite Solar Cells," filed Mar. 15, 2017; and to U.S. Provisional Patent Application No. 62/308,750 by Huang et al., entitled "Insulating Tunneling Contact for Efficient and Stable Perovskite Solar Cells," filed Mar. 15, 2016; each of which is incorporated herein by reference in its entirety.

STATEMENT REGARDING FEDERALLY SPONSORED RESEARCH AND DEVELOPMENT

This invention was made with Government support under Grant Numbers DMR1505535 and DMR1420645 awarded by the National Science Foundation, DE-EE0006709 awarded by the Department of Energy, and N00014-15-1-2713 awarded by the Office of Naval Research. The Government has certain rights in this invention.

BACKGROUND

The present disclosure generally relates to photoresponsive materials and photoelectronic devices including such photoresponsive materials, and more specifically to photoactive devices and materials including an insulating material between a photoactive perovskite material and an electrode layer.

Organolead trihalide perovskite (OTP) materials have drawn tremendous attention recently because of its great promise to fabricate next generation of low-cost and highly efficient solar cells. The power conversion efficiency (PCE) of perovskite solar cells has increased dramatically in the last few years, which has been ascribed to the excellent optoelectronic properties and unique defects physics that originates the low carrier recombination in perovskite polycrystalline thin films. Charge recombination in the grain interior can be negligible due to the absence of deep traps in OTP grains which also enables a carrier diffusion length significantly longer than the optical attenuation length in their single crystals. Even in polycrystalline perovskite thin films, the carrier diffusion lengths can still be much longer than the light penetration length, due to the enlarging grains and improving crystallinity of the perovskite films with recent rapid improvement in material morphology control. The enlargement of grains also significantly reduces carrier recombination at perovskite grain boundaries (GBs), which is facilitated by the advance of passivation techniques to further reduce recombination at GBs and the film surface. Now that the photo-generated carriers can flow through perovskite films with negligible charge recombination, minimizing the charge recombination at the contacts becomes increasingly important to achieve highly efficient perovskite solar cells.

SUMMARY

The present disclosure provides perovskite-based photoactive devices, such as solar cells, including an insulating tunneling layer inserted between the perovskite and the electron collection layer to reduce charge recombination. Many insulating polymers, including commercial plastic foam which is broadly used for packaging, can form a tunneling contact at the cathode side. The tunneling contact allows the transport of electrons from perovskite to cathode, while blocking holes from entering into the perovskite layer. Devices with these insulating materials exhibited an increased PCE of up to 20.3% under one sun illumination. This simple non-lattice-matching structure also advantageously enables the capping of the perovskite film by a hydrophobic insulating layer, which dramatically enhances resistance of perovskite devices to water-caused damage without further encapsulation.

According to an embodiment, a photoactive device is provided that typically includes a first electrode layer, a second electrode layer, a perovskite material disposed between the first electrode layer and the second electrode layer, and an insulating layer disposed between the first electrode layer and the perovskite material. In certain aspects, the first electrode layer is a cathode layer or an anode layer. In certain aspects, the first electrode layer comprises a conductive material layer disposed on a carrier transport layer, wherein the carrier transport layer is disposed between the conductive material layer and the perovskite material. In certain aspects, the insulating layer comprises an insulating dielectric material. In certain aspects, the insulating dielectric material comprises an insulating polymer material. In certain aspects, the insulating polymer material includes at least one polymer selected from the group consisting of polystyrene (PS), fluoro silane, polyvinylidenefluoride-trifluoroethylene (PVDF:TrFE), polymethyl methacrylate (PMMA), poly(dimethylsiloxane) (PDMS), polycarbonate (PC), polyvinylpyrrolidone (PVP), poly(vinyl alcohol) (PVA), poly(ethylene terepthalate) (PET), polyvinyl chloride (PVC), polypropylene (PP), and polytetrafluoroethylene (PTFE). In certain aspects, the insulating polymer material includes an amphiphilic polymer selected from the group consisting of Tween 20, Tween 40, Tween 60, Tween 80, D-α-Tocopherol polyethylene glycol 1000 succinate, PEG-PLA diblock copolymer, PEG-PLGA diblock copolymer, PEG-PCL diblock copolymer, PEG-PE diblock copolymer, PEG-PS diblock copolymer, PS-PAA amphiphilic diblock copolymer, and Triton™ X-114, where PEG is Poly(ethylene glycol), PLA is polylactide, PLGA is poly(L-lactide-co-glycolide), PCL is poly(ε-caprolactone), PE is Polyethylene, PS is Poly(styrene), and PAA is poly(acrylic acid).

In certain aspects, the photoactive device further includes a second insulating polymer material disposed between the second electrode layer and the perovskite material.

In certain aspects, the first electrode layer comprises a first conductive material layer disposed on a first carrier transport layer, wherein the first carrier transport layer is disposed between the first conductive material layer and the perovskite material, and wherein the second electrode layer comprises a second conductive material layer disposed on a second carrier transport layer, wherein the second carrier transport layer is disposed between the second conductive material layer and the perovskite material. In certain aspects, each carrier transport layer has a band gap of less than or equal to about 5.0 eV. In certain aspects, each carrier transport layer comprises at least one material selected from the group consisting of BCP, a fullerene, and a fullerene-derivative. In certain aspects, the fullerene includes one of C60, C70, C71, C76, C78, C80, C82, C84, and C92, and wherein C70 and C84 derivatives include PC70BM, IC70BA, and PC84BM.

In certain aspects, each carrier transport layer comprises at least one C60 derivative wherein the at least one C60 derivative is selected from the group consisting of C60PCBM, bis-adduct C60PCBM, tris-adduct C60PCBM, tetra-adduct C60PCBM, penta-adduct C60PCBM, hexa-adduct C60PCBM, C60ThCBM, bis-adduct C60ThCBM, tris-adduct C60ThCBM, tetra-adduct C60ThCBM, penta-adduct C60ThCBM, hexa-adduct C60ThCBM, C60 mono-indene adduct, C60 bis-indene adduct, C60 tris-indene adduct, C60 tetra-indene adduct, C60 penta-indene adduct, C60 hexa-indene adduct, C60 mono-quinodimethane adduct, C60 bis-quinodimethane adduct, C60 tris-quinodimethane adduct, C60 tetra-quinodimethane adduct, C60 penta-quinodimethane adduct, C60 hexa-quinodimethane adduct, C60 mono-(dimethyl acetylenedicarboxylate) adduct, C60 bis-(dimethyl acetylenedicarboxylate) adduct, C60 tris-(dimethyl acetylenedicarboxylate) adduct, C60 tetra-(dimethyl acetylenedicarboxylate) adduct, C60 penta-(dimethyl acetylenedicarboxylate) adduct, C60 hexa-(dimethyl acetylenedicarboxylate) adduct.

In certain aspects, the perovskite material includes a perovskite having the formula $ABX_3$ or $A_2BX_4$, wherein A is methylammonium ($CH_3NH_3+$), Cs+ or formamidinium ($H_2NCHNH_2+$), B is a metal cation, and X is a halide anion, thiocyanate (SCN—) or mixture thereof. In certain aspects, the metal cation B is $Pb^{2+}$, $Sn^{2+}$, $Cu^{2+}$, or $Bi^{3+}$ and the halide anion X includes one of I—, Cl—, Br— or a mixture thereof. In certain aspects, the perovskite material includes a single crystal perovskite. In certain aspects, the perovskite material includes a thin film perovskite material. In certain aspects, the perovskite material layer has a band gap of less than or equal to about 3.0 eV.

In certain aspects, the insulating material is hydrophobic. In certain aspects, the insulating material has a thickness of between about 0.0001 nm and about 100 nm. In certain aspects, the first electrode layer and the second electrode layer each comprise a conductive transparent or semi-transparent material selected from the group consisting of metal films, conductive polymers, carbon nanotubes, graphene, organic or inorganic transparent conducting films (TCFs), and transparent conducting oxides (TCOs).

According to an embodiment, a photoactive device is provided that typically includes a first electrode layer, a second electrode layer, a perovskite material disposed between the first electrode layer and the second electrode layer, and a cross-linked fullerene layer disposed between the first electrode layer and the perovskite material. In certain aspects, the cross-linked fullerene layer includes a fullerene crosslinked with a silane. In certain aspects, the fullerene comprises C60-SAM and the silane comprises a structure having a formula: $F_3C$—$(CF_2)_m$—$(CH_2)_n$—$Si(X)_z$$(Y)_{3-z}$, wherein: m is 0 to 16, n is 1 to 16, z is 1, 2, or 3, each X is independently selected from the group consisting of chloride, alkoxy, aryloxy, aralkoxy, hydroxyl, and halo, and each Y is independently selected from the group consisting of H, alkyl, aryl, and aralkyl. In certain aspects, the fullerene layer is doped by an I-containing species. In certain aspects, wherein the I-containing species includes $CH_3NH_3I$.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying figures. The use of the same reference numbers in different instances in the description and the figures may indicate similar or identical items.

FIGS. 1A-1F shows different device structures showing relative position of insulating layer, perovskite material(s) and electrodes according to various embodiments.

FIG. 2 shows current density-voltage (J-V) curves of the perovskite devices without insulating polymer, and with polystyrene or PVDF:TrFE as the insulating polymer layers, according to various embodiments.

Figure 3A:
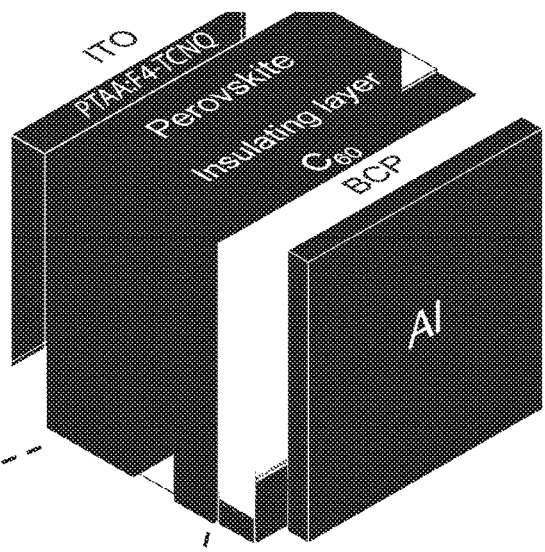
Figure 3A:
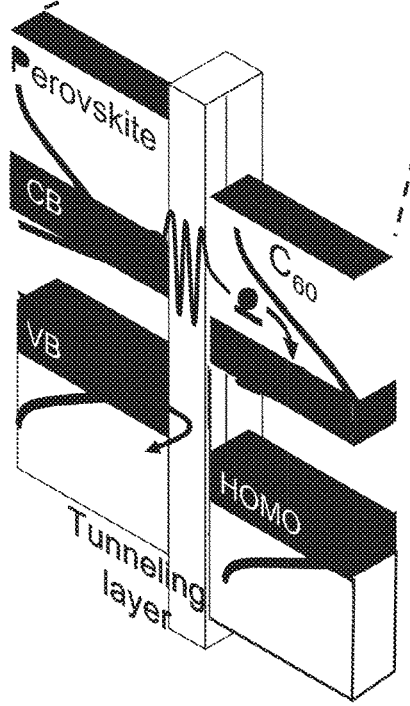
Figure 3B:
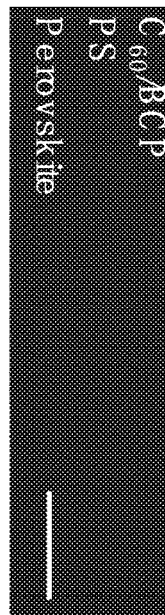
Figure 3B:
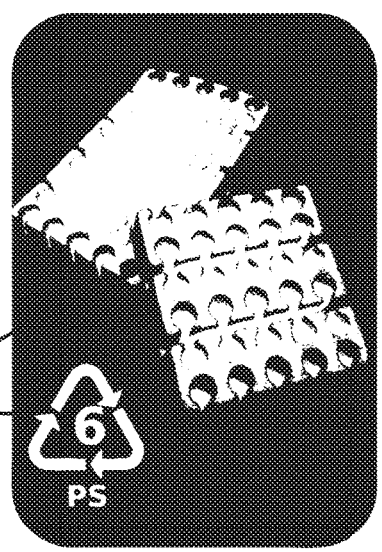

FIGS. 3A-3B illustrates device structure and mechanism of suppressing photo-generated carrier recombination by tunneling contact, according to an embodiment: FIG. 3A shows a device structure of a perovskite solar cell and the energy diagram that illustrates the principle of suppressing surface charge recombination by the insulating layer; FIG. 3B shows a transmission electron microscopy cross-section image of a 19.6% efficiency device revealing the presence of 1-2 nm PS layer between perovskite and electron transport layer. The scale bar is 5 nm. The PS layer was made from commercial PS plastic foam, the picture of which was also shown on the right.

Figure 4B:
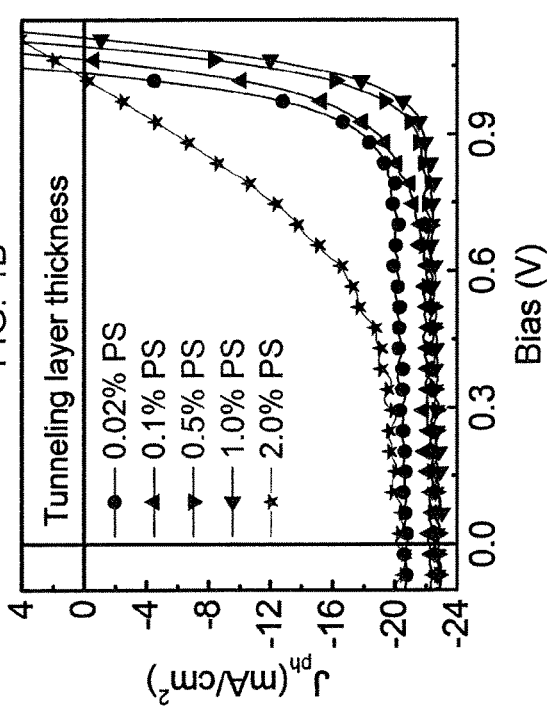
Figure 4D:
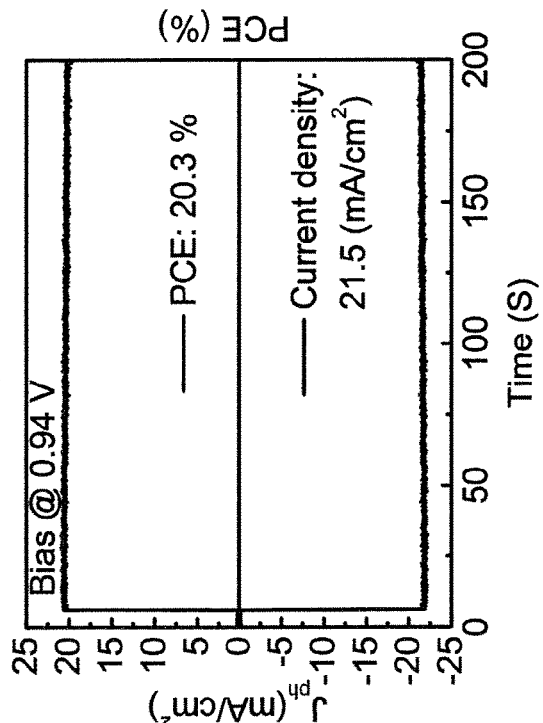
Figure 4A:
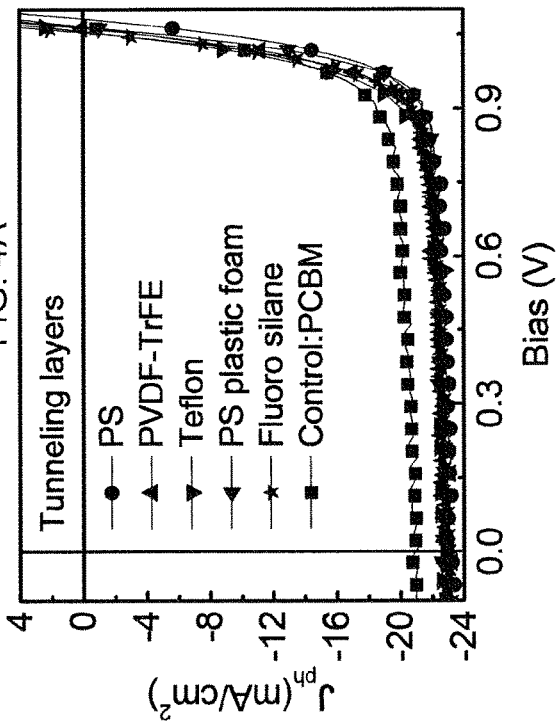
Figure 4C:
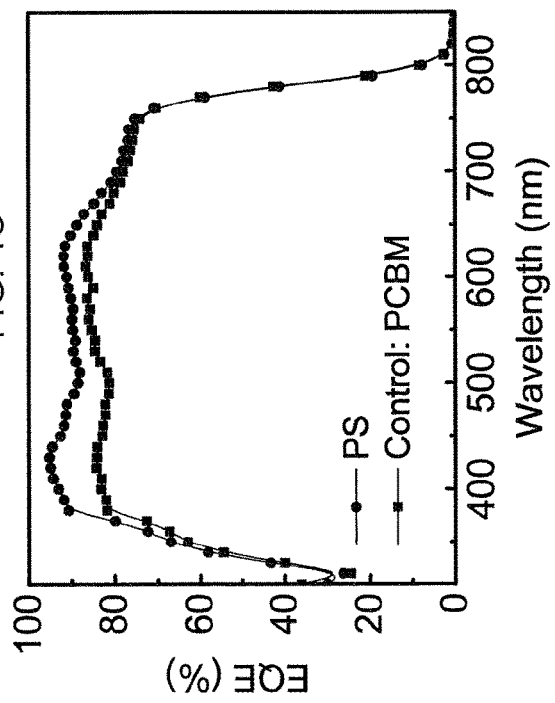

FIGS. 4A-4D shows performance of devices with different tunneling contacts: FIG. 4A shows current density-voltage (J-V) characteristics of the devices with different insulating tunneling contacts—the control device has 20 nm PCBM to replace the insulating layer; FIG. 4B shows J-V of the devices with PS layers of different thicknesses—the voltage scanning direction in the J-V measurement was from negative bias to positive bias; FIG. 4C shows EQE of one of the most efficient devices with a PS tunneling layer and EQE of the control device with a PCBM contact layer; and FIG. 4D shows steady-state measurement of $J_{SC}$ and PCE for the best device with a PS tunneling layer.

Figure 5:
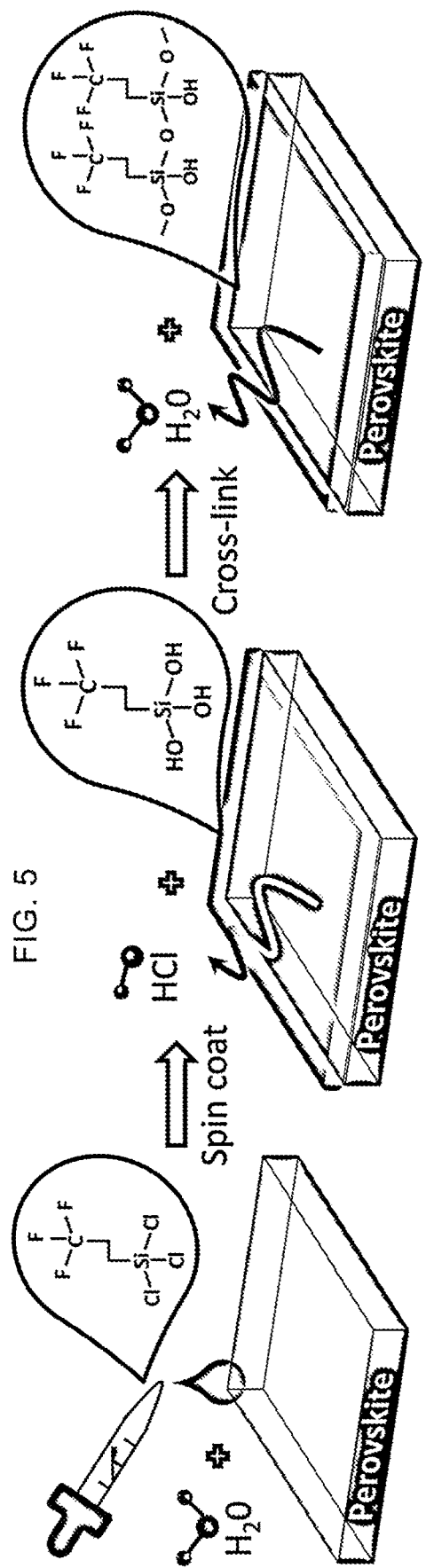

FIG. 5 shows a schematic diagram showing the cross-link process of fluoro-silane layer on the perovskite film.

Figures 6A, 6B, 6C, 6D:
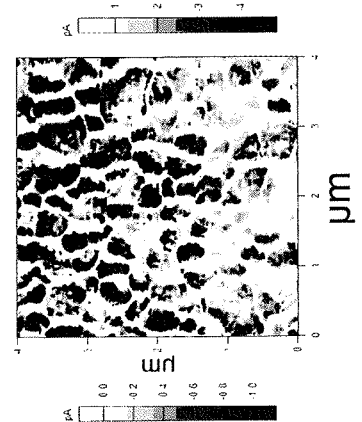
Figure 6E:
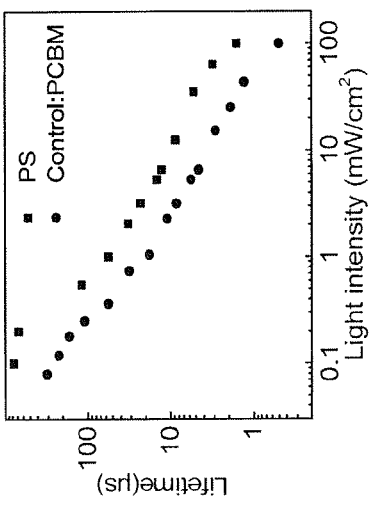
Figure 6F:
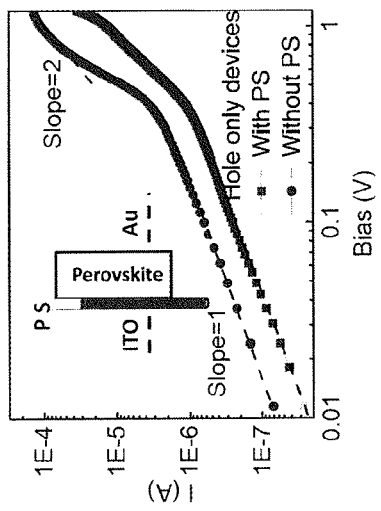
Figure 6G:
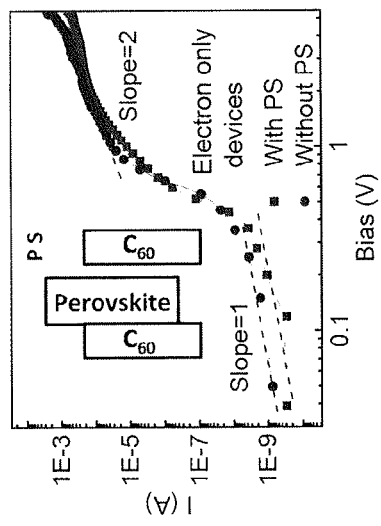

FIGS. 6A-6G illustrate water-resistant perovskite devices according to embodiments: c-AFM measurement of the local dark-current of the samples with the structures of ITO/PTAA:F4-TCNQ/Perovskite—FIG. 6A; ITO/PTAA:F4-TCNQ/Perovskite/PS—FIG. 6B; c-AFM measurement of the local photocurrent of samples with the structure of ITO/PTAA:F4-TCNQ/Perovskite/$C_{60}$—FIG. 6C and ITO/PTAA:F4-TCNQ/Perovskite/PS/$C_{60}$—FIG. 6D. Note that the photocurrent in FIG. 6C and FIG. 6D has a minus value because circuit connection followed that of the J-V curve measurement in FIGS. 2A and 2B; Current-voltage (I-V) characteristics of an electron-only device is shown in FIG. 6E and of a hole-only device is shown in FIG. 6F; the insets of FIG. 6E and FIG. 6F show the structures of electron-only and hole-only devices, respectively. FIG. 6G shows carrier recombination lifetime of perovskite devices with or without PS tunneling layer measured by TPV.

Figure 7:
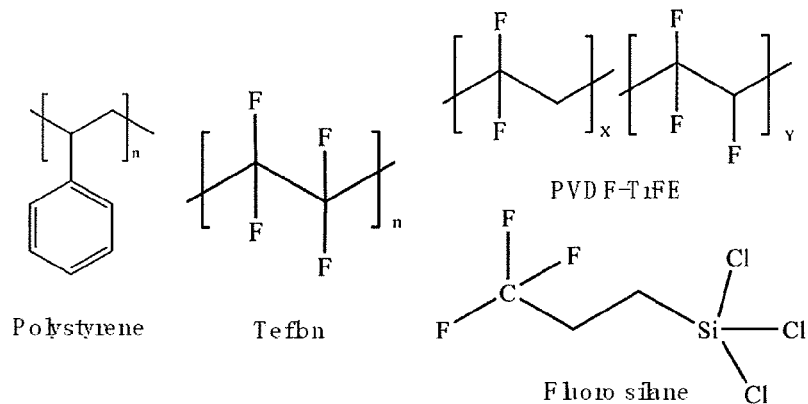

FIG. 7 shows molecular structures of useful insulating materials according to various embodiments.

FIG. 8A-8D shows statistics of $V_{OC}$, $J_{SC}$, FF and PCE distribution for perovskite devices with PCBM (50 samples) and tunneling contact (50 samples) according to various embodiments.

Figure 9:
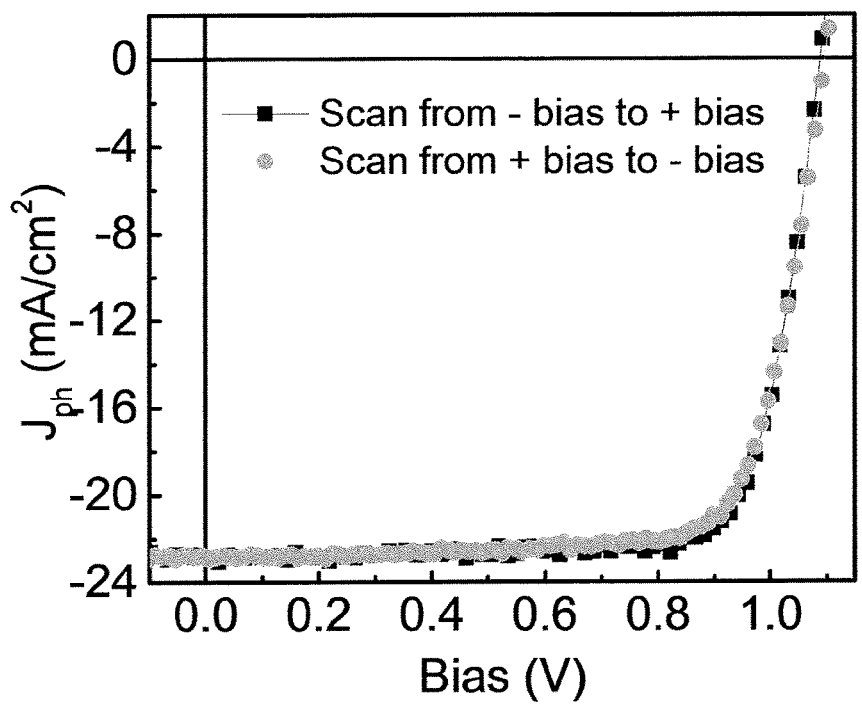

FIG. 9 shows current density-voltage characteristics of a high performance perovskite device with PS tunneling contact measured with different voltage scanning directions according to various embodiments.

Figure 10:
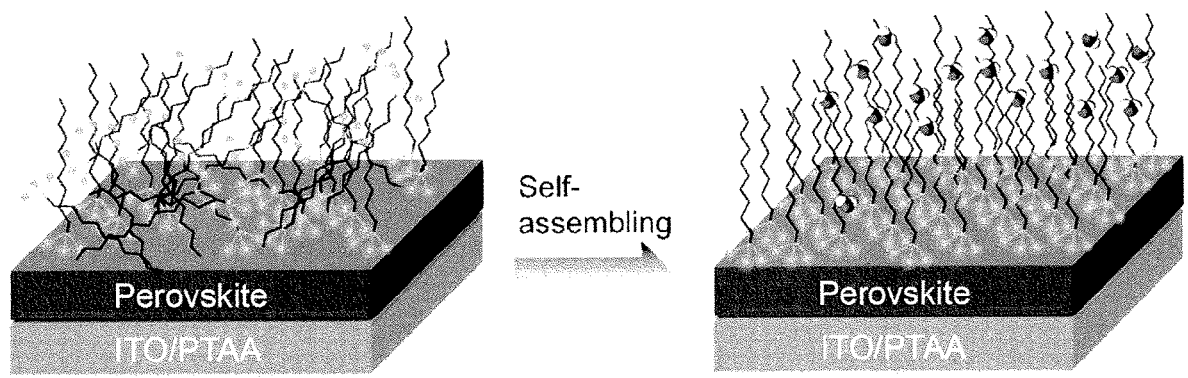

FIG. 10 shows a mechanism of an amphiphilic polymer self-assembling on the perovskite surface and exposing the hydrophobic tail or terminal end.

Figure 11:
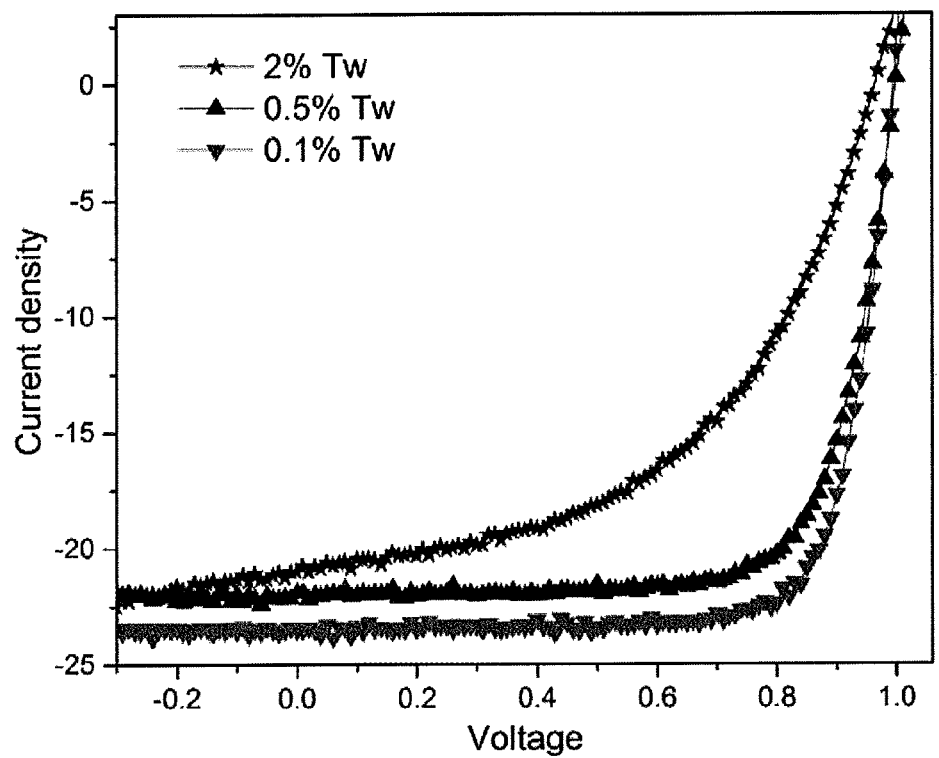

FIG. 11 shows performance of devices with Tween 20 functionalization including current density-voltage (J-V) characteristics of the devices with Tween (Tw) layers of different thicknesses.

Figure 12B:
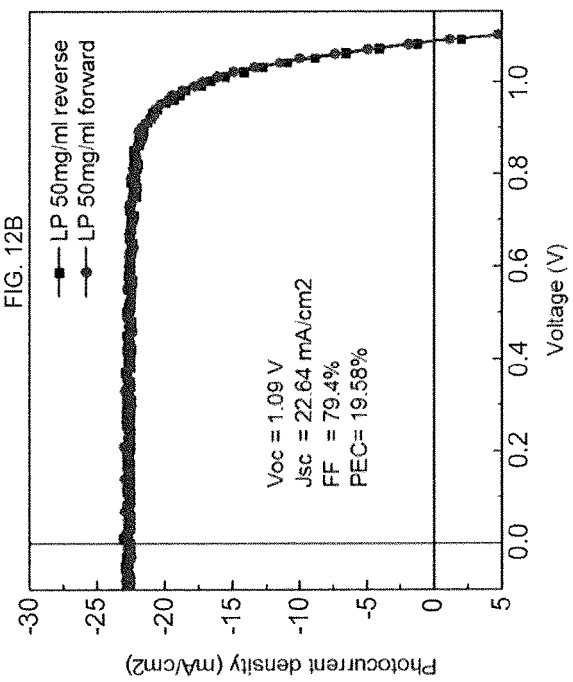
Figure 12D:
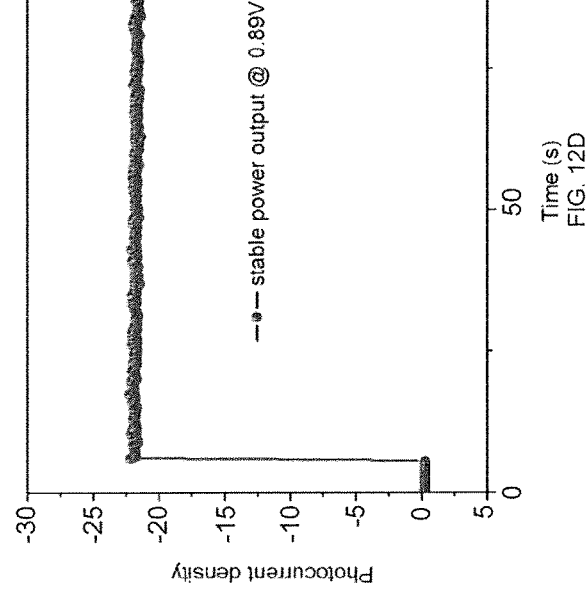
Figure 12A:
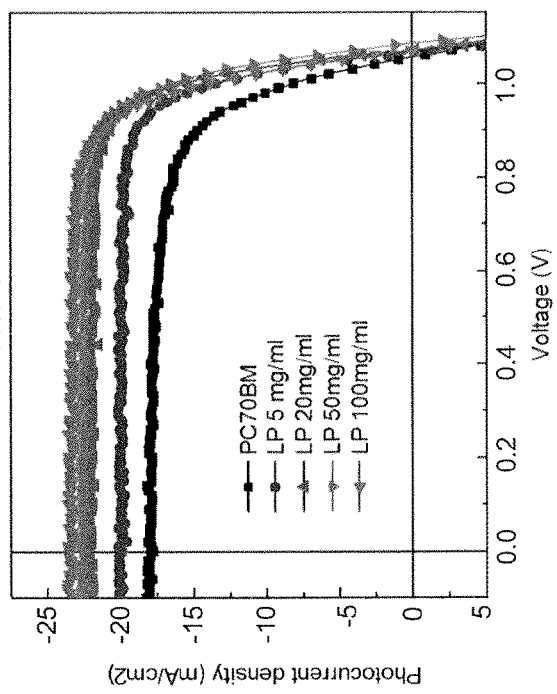
Figure 12C:
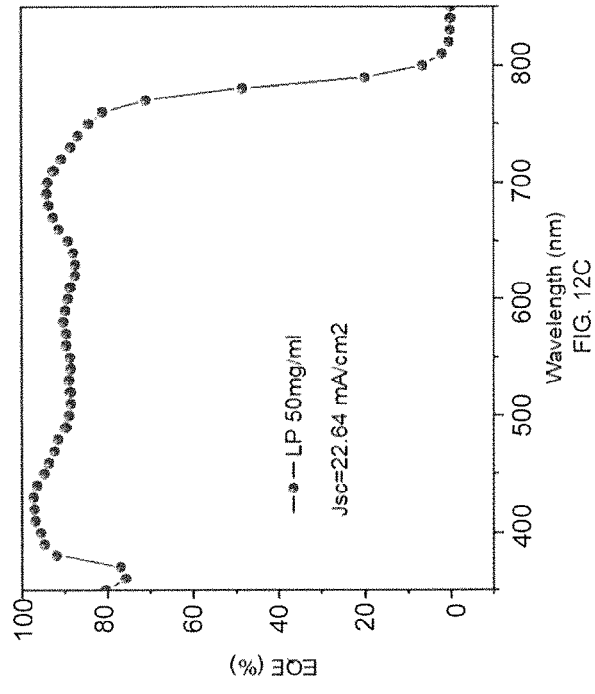

FIGS. 12A-12D shows performance of devices with L-α-Phosphatidylcholine (LP) modification: FIG. 12A shows current density-voltage (J-V) characteristics of the devices with L-α-Phosphatidylcholine (LP) modification (the control device has 20 nm PCBM to replace the L-α-Phosphatidylcholine (LP) modification layer); FIG. 12B shows J-V of the devices with L-α-Phosphatidylcholine (LP) modification with different scanning direction (the voltage scanning direction in the J-V measurement was from negative bias to positive bias); FIG. 12C shows EQE of one of the more efficient devices with L-α-Phosphatidylcholine (LP) modification; and FIG. 12D shows photocurrent output of devices with L-α-Phosphatidylcholine (LP) modification.

Figure 13A:
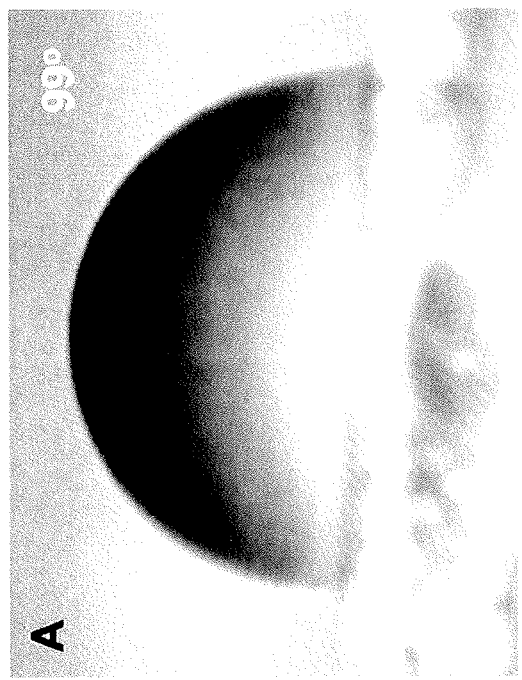
Figure 13B:
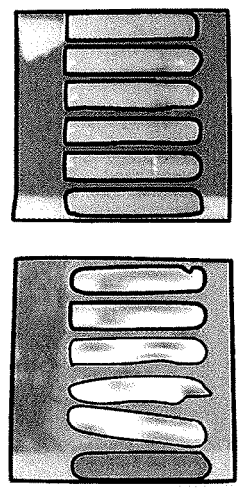

FIG. 13A shows the contact angle of water on the Tween 20 modified perovskite film surface, and FIG. 13B shows a picture of the perovskite device with PCBM coating (left) and Tween 20 surface modification (right), where the picture was taken after dipping the device in water for 2 min.

Figure 14:
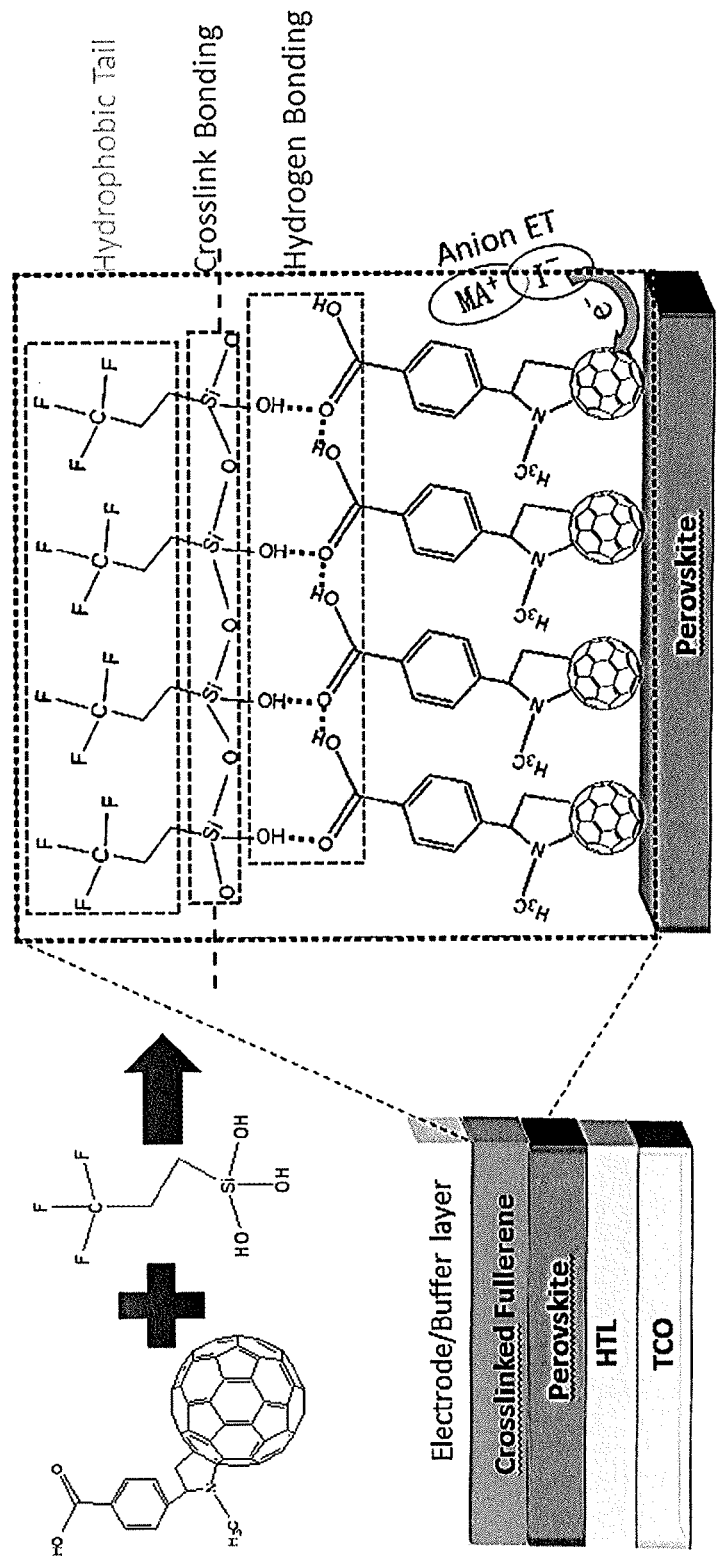

FIG. 14 shows an embodiment of a device structure of a perovskite planar heterojunction photoactive device and a schematic illustration of C60-SAM crosslinked with silane-coupling agent. ET: electron transfer.

FIG. 15A shows FTIR spectra of the fullerene films before and after crosslinking by the silane-coupling agent; FIG. 15B shows the contact angles of water on pristine fullerene/perovskite film, and FIG. 15C shows the contact angles of water on crosslinked fullerene/perovskite film.

Figure 16A:
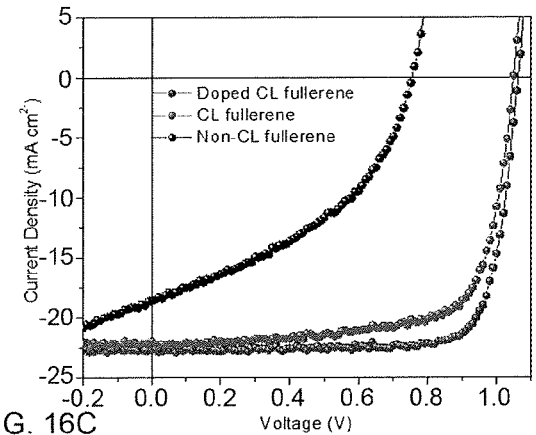
Figure 16B:
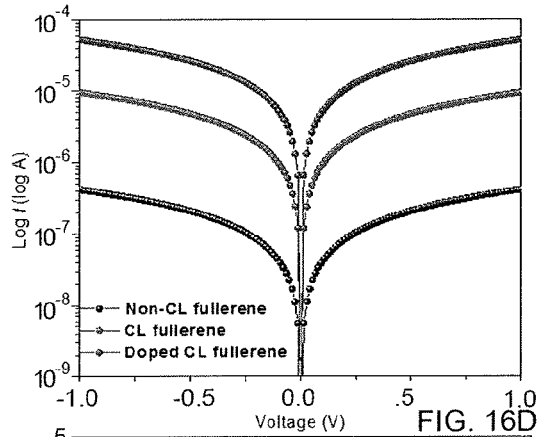
Figure 16C:
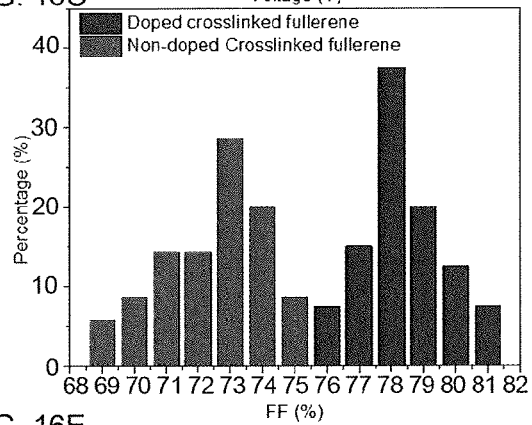
Figure 16D:
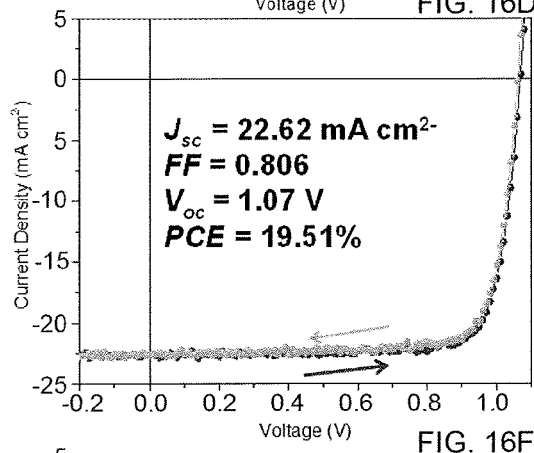
Figure 16E:
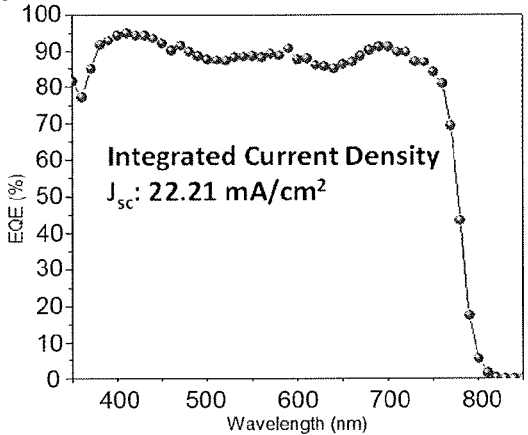
Figure 16F:
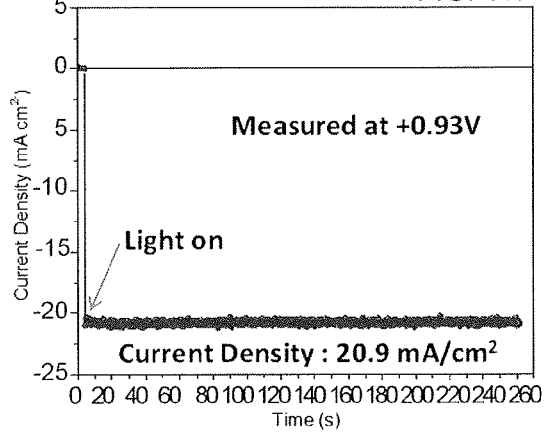

FIG. 16A shows J-V curves of perovskite solar cells based on different fullerene ETLs; FIG. 16B shows a comparison of the I-V characteristics of non-crosslinked, crosslinked, and crosslinked and doped fullerene films deposited on normal glass substrates obtained by four-probe conductivity measurement; FIG. 16C shows statistics of the FF distribution for devices with non-doped crosslinked fullerene (35 samples) and doped crosslinked fullerene (40 samples); FIG. 16D shows J-V curves with different scanning directions; FIG. 16E shows EQE (the integrated current density is 22.21 mA cm$^{-2}$); and FIG. 16F shows steady-state photocurrent output at the maximum power point (0.93 V) of the perovskite device with crosslinked and doped fullerene ETL.

Figure 17A:
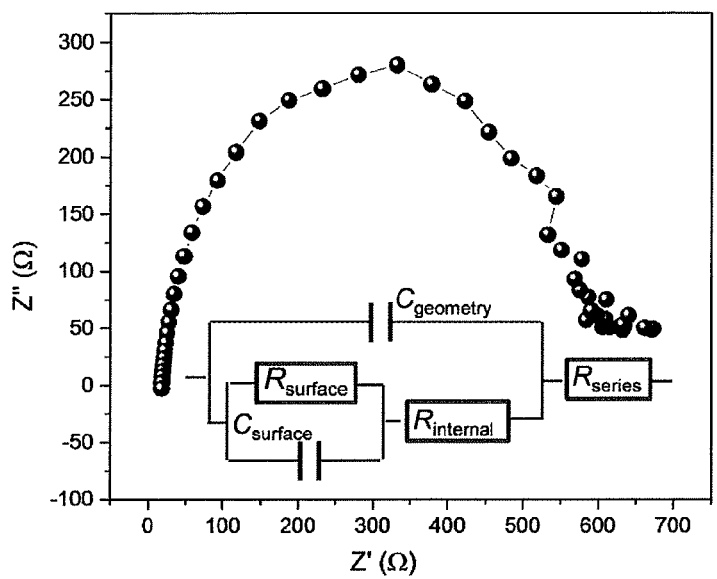
Figure 17B:
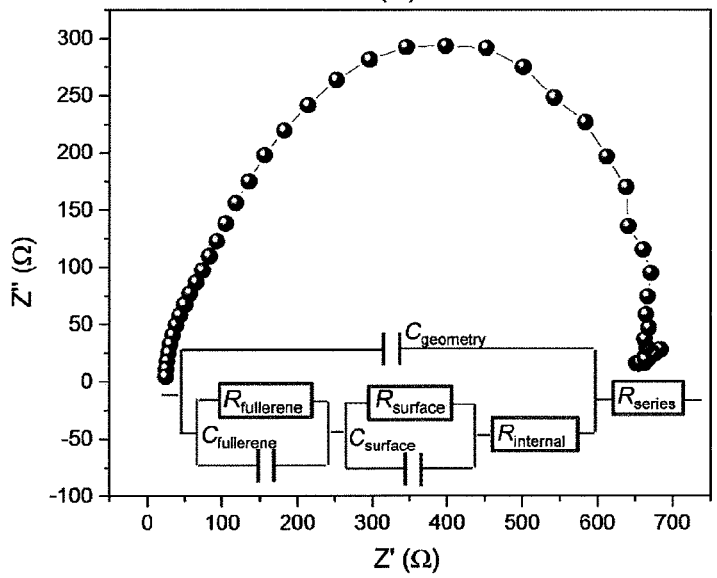
Figure 17C:
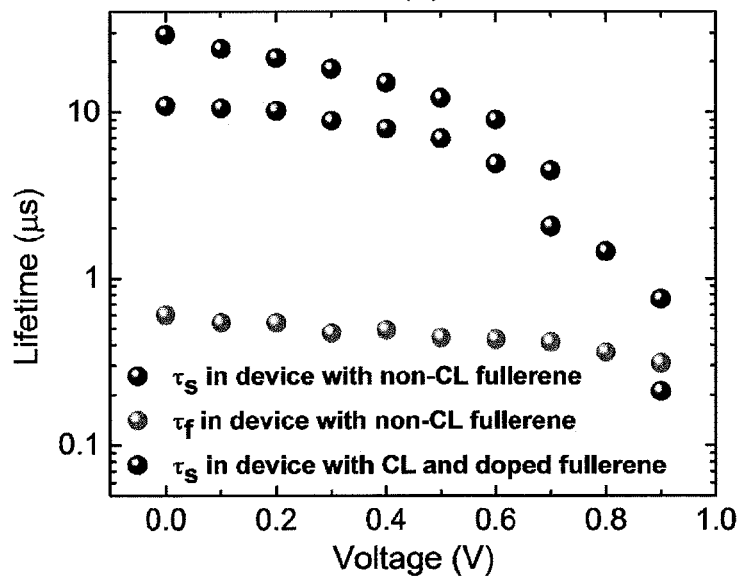

FIGS. 17A-17B illustrates typical impedance spectra of perovskite devices with (a) doped CL fullerene and (b) non-CL fullerene; insets of FIGS. 17A and 17B: the equivalent circuits for impedance spectroscopy fitting. FIG. 17C shows recombination lifetime of different recombination processes extracted from the impedance spectroscopy modeling.

Figure 18:
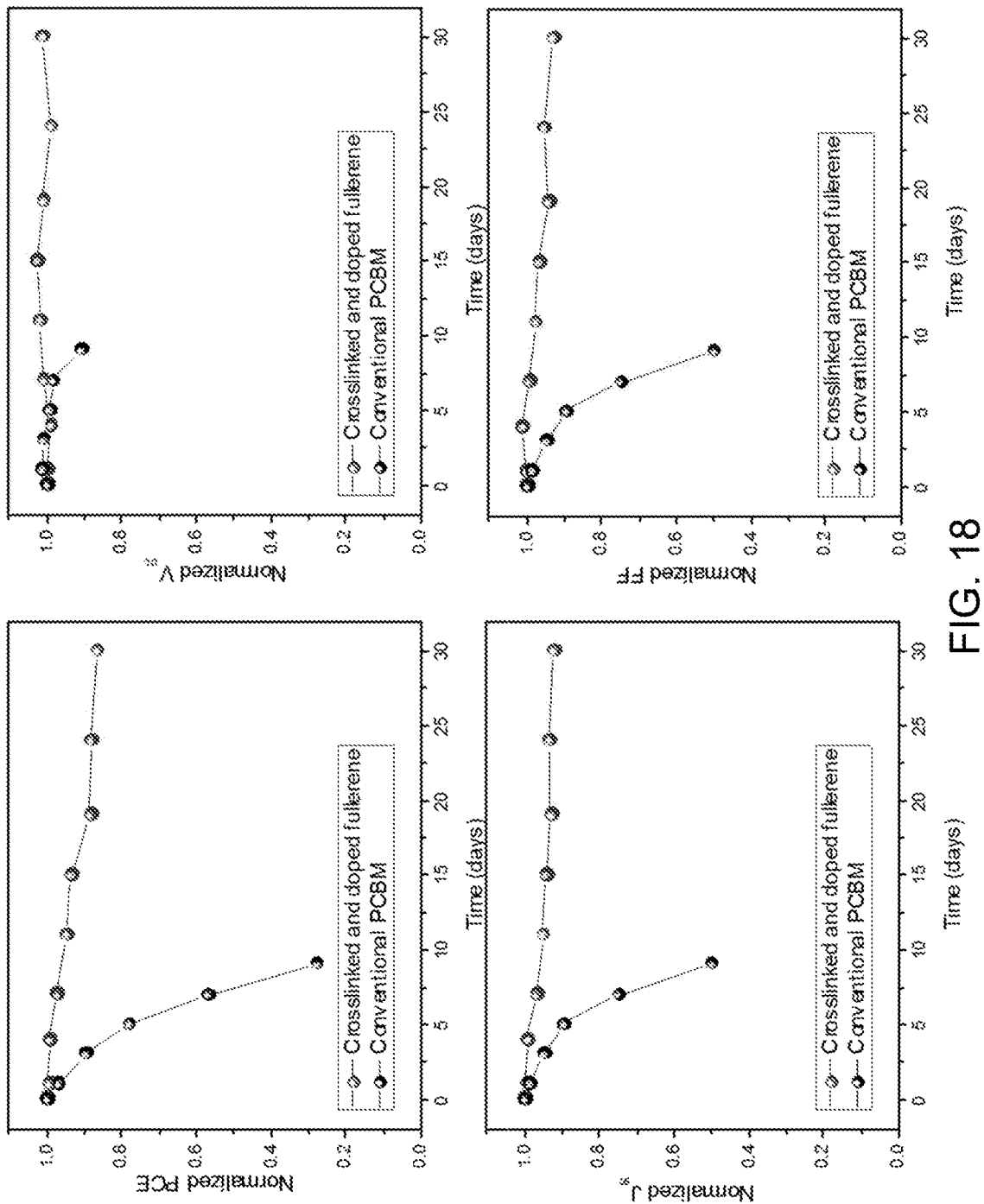

FIGS. 18A-18D shows stability of the perovskite devices with crosslinked fullerene (red) and conventional PCBM (black) ETLs in an ambient environment without encapsulation as a function of storage time. FIG. 18A shows normalized PCE; FIG. 18B shows normalized $V_{oc}$; FIG. 18C shows normalized $J_{sc}$; and FIG. 18D shows normalized FF.

FIG. 19 shows a cross-section SEM image of a typical perovskite device with crosslinked fullerene ETL.

FIGS. 20A-20B shows SEM images of fullerene films without (FIG. 20A) and with (FIG. 20B) silane crosslinking.

Figures 21A, 21B:
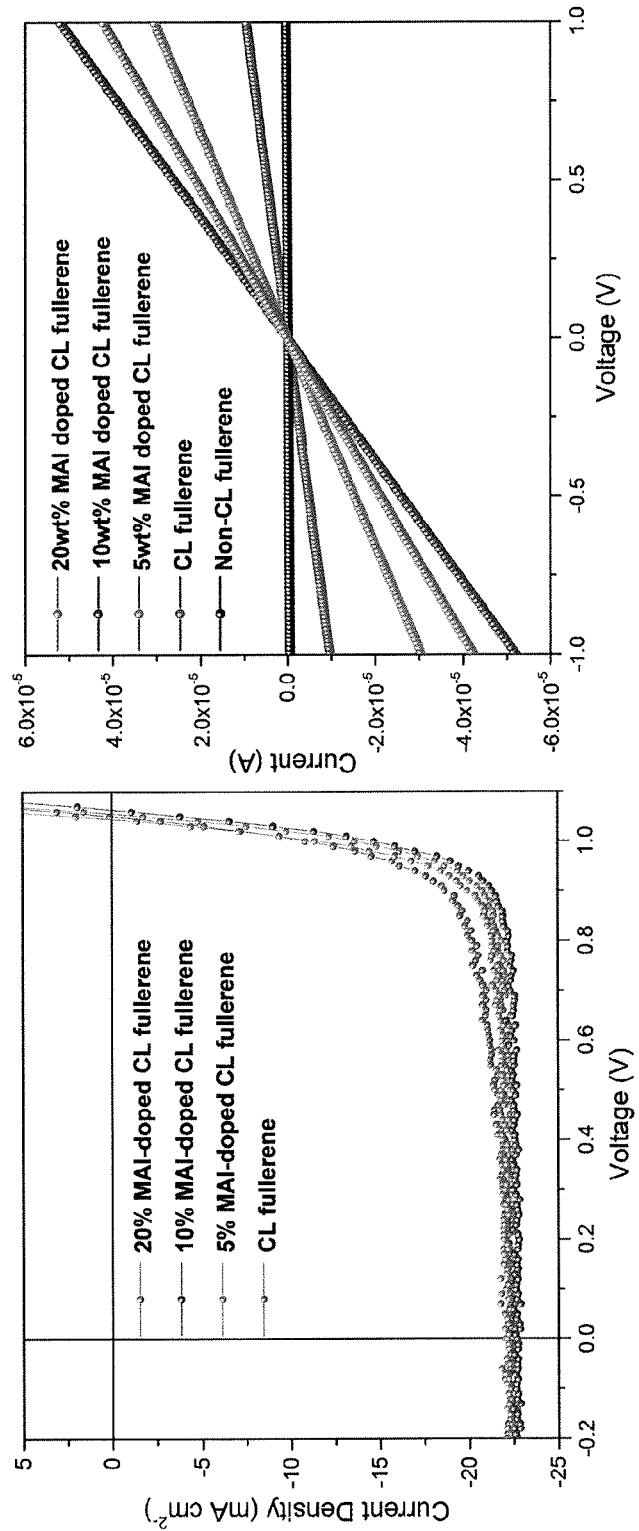

FIG. 21A shows J-V curves of perovskite solar cells based on crosslinked fullerene with different amounts of MAI dopant; FIG. 21B shows I-V characteristics of crosslinked fullerene films with different doping levels deposited on normal glass substrates obtained by four-probe conductivity measurement.

Figure 22A:
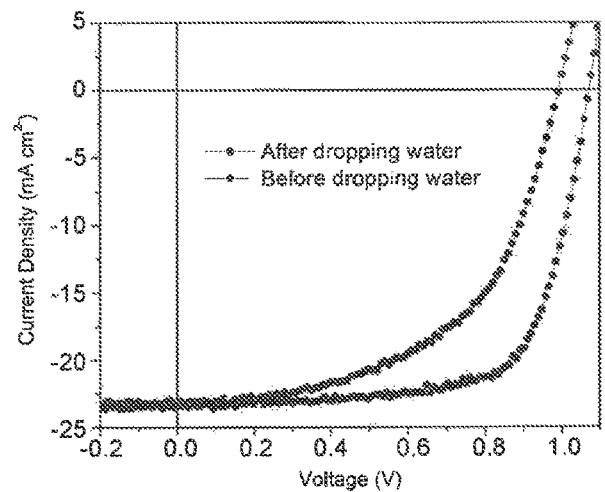
Figure 22B:
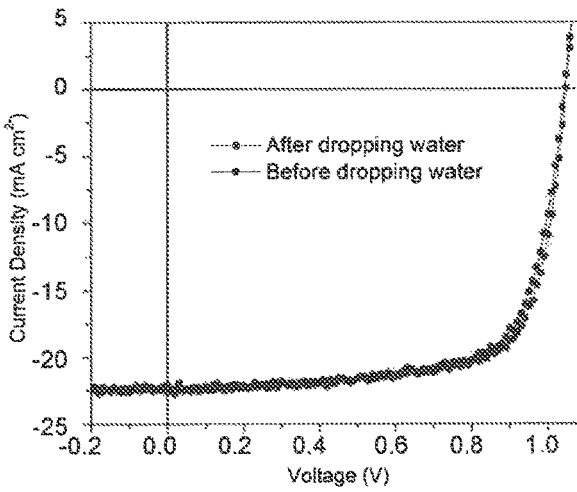

FIG. 22A-22B shows J-V curves of the devices based on conventional PCBM (FIG. 22A) and crosslinked C60-SAM (FIG. 22B) ETLs before and after dipping into water.

Figure 23A:
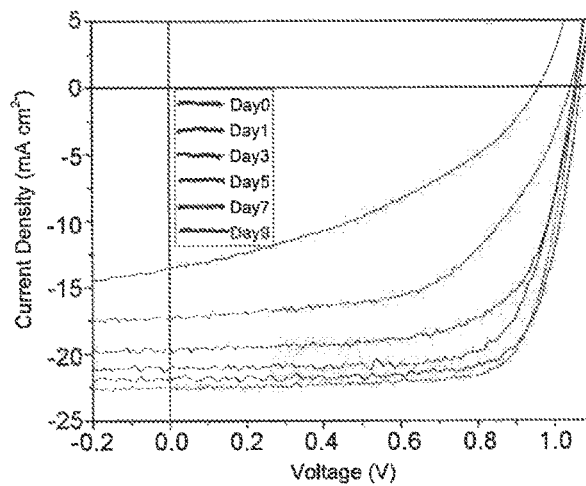
Figure 23B:
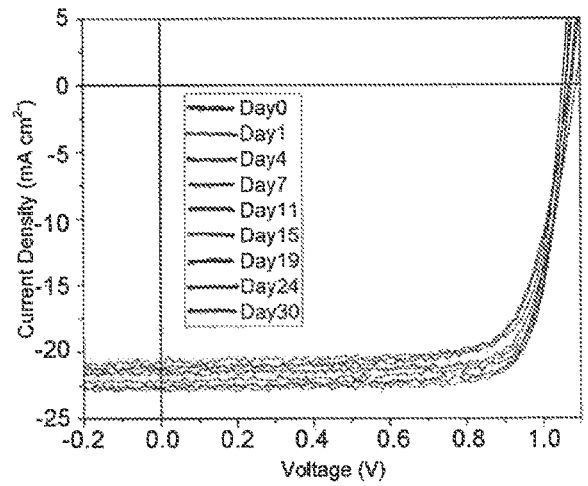

FIGS. 23A-23B shows J-V curves of perovskite device fabricated with PCBM (FIG. 23A) and crosslinked and doped fullerene (FIG. 23B) stored in ambient air for various numbers of days.

DETAILED DESCRIPTION

The present disclosure provides perovskite-based photoactive devices, such as solar cells, including an insulating tunneling layer inserted between the perovskite and the electron collection layer to reduce charge recombination and concomitantly provide water resistant properties.

Certain embodiments of the present disclosure provide perovskite optoelectronic devices comprising (i) a perovskite layer; (ii) a layer of insulating dielectric material(s) in contact with the perovskite layer; and (iii) electrodes including anode and cathode on either side of the perovskite layer. The perovskite layer, which has a band gap of less than or equal to 3.0 eV, can be an elemental perovskite semiconductor or a perovskite compound. The insulating dielectric material(s) refer to one or more materials with electronic conductivity of less than or equal to about $10^{-5}$ S/m. The insulating dielectric materials can be deposited to form a non-continuous or a continuous layer on a surface of the perovskite (example device structure shown in FIGS. 1A, 1B, 1D, 1E), or on more than one surface of the perovskite (example device structure shown in FIGS. 1C, 1F). For devices with insulating materials on a single surface of the perovskite, the insulating material can be deposited on the top surface of the perovskite (e.g., FIG. 1A and FIG. 1D), or on the bottom surface of the perovskite (e.g., FIG. 1B and FIG. 1E). The anode and cathode can comprise materials with conductivity higher than or equal to about 1000 S/m. Examples include metals or semiconductors or conductive polymers. In certain embodiments, each electrode also comprises a carrier transporting material layer including one or more carrier transporting materials. The carrier transporting layers comprise material(s), e.g., semiconductors, with a band gap of less than or equal to about 5.0 eV. Either anode or cathode can be deposited on a substrate, serving as a foundation upon which other materials can be deposited. FIGS. 1A, 1B and 1C show the structures of devices with a cathode on a substrate. FIGS. 1D, 1E and 1F show the structures of devices with an anode on the substrate.

Useful anode materials include any transparent or semi-transparent conductive or semi-conductive material, such as metals or metal films, conductive polymers, carbon nanotubes, graphene, organic or inorganic transparent conducting films (TCFs), transparent conducting oxides (TCOs), etc. Specific examples of anode materials include gold (Au), silver (Ag), titanium (Ti), indium tin oxide (ITO), copper (Cu), carbon nanotubes, graphene, aluminum (Al), chromium (Cr), lead (Pb), platinum (Pt), and PEDOT:PSS. The dimensions of an anode layer may be varied depending on the material used. For example, the anode may have a thickness of between about 10 nm and about 100 nm or 100 nm or greater (e.g., less than about 200 nm, or less than about 1000 nm), depending on the properties of the materials used, such as the transparency and the conductivity. Known deposition or thermal evaporation techniques may be used to form the anode layer. Useful cathode materials include the same materials as may be used for the anode, although the cathode need not be transparent. Specific examples of cathode materials include gallium (Ga), gold (Au), silver (Ag), tin titanium (Ti), indium tin oxide (ITO), indium (In), copper (Cu), carbon nanotubes, graphene, aluminum (Al), chromium (Cr), lead (Pb), platinum (Pt), and PEDOT:PSS. The dimensions of the cathode layer may be varied depending on the material used. For example, the cathode may have a thickness of between about 10 nm and about 100 nm or 100 nm or greater (e.g., less than about 200 nm, or less than about 1000 nm, or less than about 1 µm, or less than about 1 mm, or less than about 1 cm), depending on the conductivity of the materials used. Known deposition or thermal evaporation techniques may be used to form the cathode layer. A substrate, upon which an anode layer or a cathode layer may be formed, may be used to provide structural stability and may include glass, polymer, semiconductor materials, etc.

The function of the insulating dielectric layer(s) includes, but is not limited to, passivating surface traps, reducing minority carrier recombination, suppressing perovskite decomposition caused by, e.g., thermal annealing or moisture damage. The insulating dielectric layer(s) could significantly increase optoelectronic device short circuit current (JSC) to ~23 mA/cm$^2$ and fill factor (FF) to ~80%, leading to a high power conversion efficiency (PCE) of 19%-20% under 1 sun illumination. Meanwhile, due to the protection of the insulating layer(s), the perovskite surface decomposition caused by thermal annealing could be suppressed. And the devices advantageously exhibit an excellent resistance to moisture damage which is the primary reason for perovskite solar cell degradation. Typical insulating dielectric materials include, but are not limited to, dielectric oxides such as Al$_2$Ox, insulating polymers such as polystyrene (PS), polyvinylidenefluoridetrifluoroethylene (PVDF-TrFE), polymethyl methacrylate (PMMA), poly(dimethylsiloxane) (PDMS), polycarbonate (PC), polyvinylpyrrolidone (PVP), poly(vinyl alcohol) (PVA), poly(ethylene terephthalate) (PET), polyvinyl chloride (PVC), polypropylene (PP), polytetrafluoroethylene (PTFE), or a combination thereof. In certain embodiments, the insulating polymer material includes an amphiphilic polymer material. Examples of useful amphiphilic materials include Tween 20, Tween 40, Tween 60, Tween 80, D-α-Tocopherol polyethylene glycol 1000 succinate, PEG-PLA diblock copolymer, PEG-PLGA diblock copolymer, PEG-PCL diblock copolymer, PEG-PE diblock copolymer, PEG-PS diblock copolymer, PS-PAA amphiphilic diblock copolymer, and Triton™ X-114, where PEG is Poly(ethylene glycol), PLA is polylactide, PLGA is poly(L-lactide-co-glycolide), PCL is poly(ε-caprolactone), PE is Polyethylene, PS is Poly(styrene), and PAA is poly(acrylic acid), and combinations thereof It has been demonstrated as will be discussed below that inserting a polymer insulation layer at the cathode side of the perovskite solar cell devices effectively increases the efficiency of the perovskite solar cells. As one example, a perovskite solar cell with polymer insulating layer may have a structure of ITO/PTAA/CH$_3$NH$_3$PbI$_3$ perovskite/polymer insulator/C60/2,9-dimethyl-4,7-diphenyl-1,10-phenanthroline (BCP)/Al. The thickness of the cell could be from about 0.0001 nm to about 100 nm, and it may be continuous or noncontinous. For the solution process methods, the insulating polymer may be dissolved in non-polar solvent such as toluene, dimethylbenzene, chloroform, tetrahydrofuran, chlorobenzene or dichlorobenzene or a combination thereof, and the concentration can be from about 0.0001 mg/ml to about 100 mg/ml.

FIG. 2 compares the photocurrents of perovskite devices with and without an insulating polymer layer. Here, two kinds of insulating polymers, polystyrene and PVDF:TrFE, were used, both of which significantly improved device performance, especially short circuit current. The perovskite device without polymer exhibited a JSC of 20.8 mA/cm$^2$, FF of 76.2%, open circuit voltage (VOC) of 1.06V, and PCE of 16.8%. On the contrary, the polystyrene insulating layers significantly increased the device performance, with a JSC of 22.7 mA/cm$^2$, FF of 79.0%, open circuit voltage (VOC) of 1.06V, and PCE of 19.0%. Another insulating polymer, PVDF-TrFE, was also demonstrated to be effective in increasing the device performance. It should be noted that the two polymers used here have obvious difference in molecular structure, indicating that many polymer materials with different molecular structures can be used as the insulating layer to increase the performance of perovskite solar cells.

The tunneling junctions applied in silicon solar cells, which resulted in efficient silicon solar panels, are comprised of an insulating oxide or a thin-layer of amorphous silicon (HIT structure) inserted between the intrinsic silicon and the heavily-doped silicon layer or indium-tin-oxide (ITO) layer. The tunneling junctions have been shown to suppress the charge recombination at contacts by passivation to increase efficiency. The oxide or amorphous silicon layers are generally deposited by relatively high temperature vacuum process, which is however not compatible for perovskite solar cells. Encouragingly, it has been found that the low temperature solution-coated polymeric insulating layers can serve the same function, which makes the process low-cost and simple to be applied. FIG. 1A shows structures of exemplary devices where the tunneling junction is located at the cathode side. An insulating polymer is inserted between the perovskite and the electron collecting fullerene (e.g., C$_0$) layer, and the corresponding energy diagram is also shown to illustrate the principle of suppressing surface charge recombination by the insulating layer. The thin insulating layer allows the transport of photo-generated electrons in perovskite to fullerene layer by tunneling, because the conduction band minimal (CBM) of perovskite falls in the conduction band range of the fullerene (e.g., C$_{60}$). The insulating layer also blocks the photo-generated holes back into the perovskite layer because of the large energy barrier and the absence of electronic state with the same energy in C$_{60}$ to tunnel into. Therefore, the insulating tunneling layer causes a spatial separation of the photo-generated electrons and holes, which reduces their recombination at the contact of the perovskite and electron transport layers.

The perovskite films may be made by an interdiffusion method, e.g., as described in U.S. patent application Ser. No. 14/576,878, filed Dec. 19, 2014, which is incorporated by reference herein. Poly(triaryl amine) (PTAA) is useful as the hole transporting layer because of the much larger perovskite grain size formed on the non-wetting surface of PTAA. The PTAA film was doped by 1.0 wt % 2,3,5,6-Tetrafluoro-7,7,8,8-tetracyanoquinodimethane (F4-TCNQ) to increase its conductivity, which was found important in increasing perovskite device fill factor. Three insulating polymers, polystyrene (PS), Teflon, and polyvinylidene-trifluoroethylene copolymer (PVDF-TrFE), were randomly chosen for use as the tunneling materials. The molecular structures are shown in FIG. 7. The details of device fabrication can be found in the experimental section. The insulating polymers spun on the perovskite films could form a conformal tunneling layer, as verified by the high resolution transmission electron microscopy (TEM) cross-section image of the devices. As shown in FIG. 3B, the spun PS layer with a thickness of 1-2 nm conformably covers the perovskite layer.

Figure 8A:
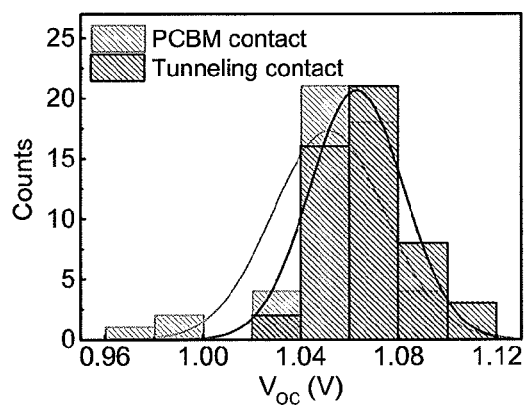
Figure 8B:
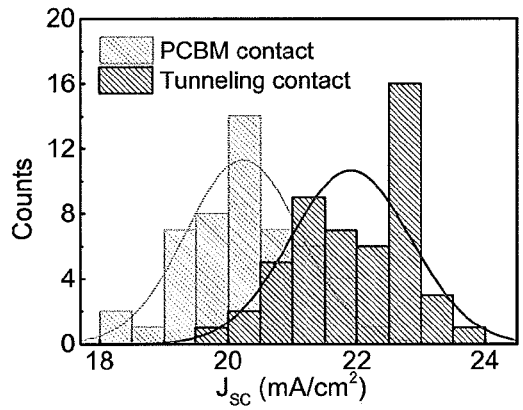
Figure 8C:
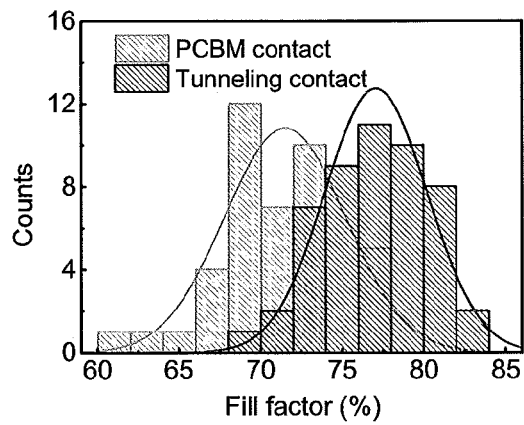
Figure 8D:
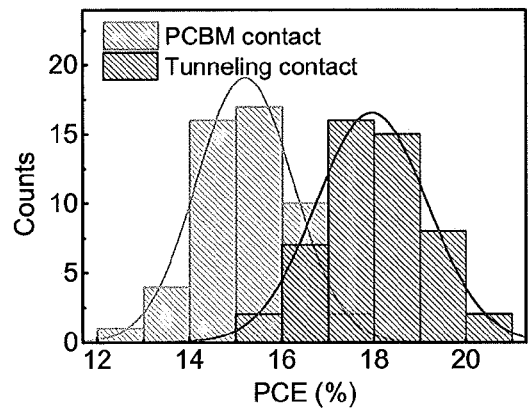

FIG. 4A shows the photocurrent curves of perovskite devices with different insulating polymers inserted and that of the control device with 20 nm [6,6]-phenyl-C61-butyric acid methyl ester (PCBM) to replace the insulating polymer layer. The control device has a short circuit current density ($J_{SC}$) of 21.1 mA/cm$^2$, an open circuit voltage ($V_{OC}$) of 1.07 V, a fill factor (FF) of 74.9%, and a PCE of 16.9%, which represent a typical performance of PCBM passivated perovskite devices. In striking contrast, the devices with polymer tunneling contacts exhibited an increased $J_{SC}$ and FF. The devices with PS, PVDF-TrFE and Teflon tunneling layer showed higher $J_{SC}$ of 22.9 mA/cm$^2$, 22.9 mA/cm$^2$ and 22.8 mA/cm$^2$, respectively. Meanwhile, the FFs for devices with inserted PS, PVDF-TrFE and Teflon tunneling contacts were also increased to 79.6%, 77.6% and 75.6%, respectively. It should be noted that the $V_{OC}$ of the perovskite devices with tunneling contacts fabricated from different batches slightly varied between 1.05 V to 1.11 V. Statistic $V_{OC}$ distributions of 50 samples in FIG. 8A shows that the devices with tunneling contacts have a higher average $V_{OC}$ of 1.07 V, compared with 1.05 V of the control devices. The statistics of $J_{SC}$, FF, and PCE distribution in FIGS. 8B, 8C and 8D, respectively, demonstrates the reliability and the repeatability of the performance enhancement by the tunneling contacts. The universal performance enhancement by different insulating polymers shows, or at least implies, that it is not related to the chemistry at the interface. It is interesting to note that the PS plastic foam, which is broadly used for packaging, worked as well. A picture of the PS plastic foam used is shown in FIG. 3B. The perovskite device with PS from dissolved foam as the tunneling layer exhibited a $J_{SC}$ of 22.9 mA/cm$^2$, a $V_{OC}$ of 1.07 V, a FF of 80.3% and a PCE of 19.6%. The device performance is slightly higher than those devices with the other three polymers with higher purity.

Because the tunneling probability strongly depends on tunneling-layer thickness, the thickness of the tunneling layer should significantly influence the electron extraction efficiency and thus device efficiency. FIG. 4B shows the photocurrent curves of perovskite devices with PS layers of different thicknesses which were tuned by varying the concentration of PS solution in the spin-coating process. As shown in FIG. 4B, for a PS solution with a concentration of 0.02%, the device showed a $J_{SC}$ of 20.8 mA/cm$^2$, a $V_{OC}$ of 1.05 V, a FF of 75.1% and a PCE of 16.4%, which is comparable to that of the PCBM-passivated devices. This can be explained by the fact that the PS layer formed from the solution with a low PS concentration is barely continuous, and thus the device resembles the control device without a PS layer. When the PS concentration was increased to 0.1%, 0.5% and 1.0%, the photocurrents were significantly increased to 22.0 mA/cm$^2$, 22.8 mA/cm$^2$ and 22.9 mA/cm$^2$, respectively. Excellent devices were made by 1.0% PS solution, exhibiting a $V_{OC}$ of 1.10 V, a $J_{SC}$ of 22.9 mA/cm$^2$, a FF of 80.6% and a PCE of 20.3% from the photocurrent scanning. For these devices, the PS layer thickness was estimated to be 1-2 nm from the high resolution TEM shown in FIG. 6B. Further increasing the PS layer thickness severely reduced the $J_{SC}$, $V_{OC}$, and FF to 20.0 mA/cm$^2$, 1.03 V and 49.0%, respectively, because the increased tunneling layer thickness reduced the electron tunneling rate. FIGS. 4C-4D show the external quantum efficiency (EQE) spectrum, steady photocurrent and PCE measured at the maximum power output point (0.94 V) of one very efficient device. The calculated $J_{SC}$ from EQE is 22.0 mA/cm$^2$. The steady photocurrent, stabilized PCE measured at the maximum power point agrees well with that measured from J-V scanning, excluding the existence of photocurrent hysteresis in the devices and confirming the accuracy of the device efficiency characterization. The absence of photocurrent hysteresis of these devices is also confirmed by changing the photocurrent scanning directions (see, e.g., FIG. 9). It has recently been demonstrated that ion migration at grain boundaries plays a dominant role in causing the photocurrent hysteresis. (See, e.g., Yu, H. et al. The Role of Chlorine in the Formation Process of "CH3NH3PbI3-xClx" Perovskite. Adv. Func. Mater. 24, 7102-7108 (2014)). Any material which can block the ion migration channel at grain boundaries is expected to eliminate the photocurrent hysteresis.

The insulating polymer advantageously serves or functions as a water-resistant layer that protects the perovskite film from water damage. According to one embodiment, a hydrophobic insulating fluoro-silane, Trichloro(3,3,3-trifluoropropyl)silane, is used as a tunneling layer to make water-resistant devices. The fluoro groups make the material extremely hydrophobic. In addition, it has been reported that fluoro-silane undergoes a cross-linking process with the aid of tiny amount of moisture. FIG. 5 illustrates the cross-linking process of this material. When fluoro-silane is deposited on top of the perovskite films, tiny amount of H$_2$O that exists in the perovskite films trigger the hydroxylation of silanes to form silanols. Then the silanols will automatically undergo a cross-linking process by forming Si—O—Si (siloxane) bonds, which makes this insulating layer robust to protect the underneath perovskite films from water. The devices with the fluoro-silane layer also showed a good efficiency of 18.9% (FIG. 4A), which is comparable to the performance of devices with other types of tunneling contacts. Encouragingly, the hydrophobic polymer protected devices showed much better resistance to water damage. The perovskite device with fluoro-silane layer without further encapsulation exhibited negligible color change after it was soaked in water for 1-3 minutes, while the control device with 20 nm PCBM changed to yellow color after it was immersed in water for less than 5 seconds. The operation of the un-encapsulated device in water was also demonstrated and showed a $V_{OC}$ of 1.09 V which is slightly higher than that of the device measured under one sun condition (FIG. 4A). The slight variation in $V_{OC}$ might be caused by the optical effect of the water or glass beaker which slightly change the light illumination intensity to increase device $V_{OC}$.

The performance enhancement in the devices is primarily ascribed to the function of the tunneling layer in extracting electrons and blocking holes. To demonstrate that, conductive atomic force microscopy (c-AFM) measurement was conducted to characterize the local dark- and photo-current of perovskite samples with or without a PS tunneling layer at nanoscopic level. The samples for dark-current measurements have the structure of ITO/PTAA: F4-TCNQ/Perovskite/with or without PS. Since both PTAA and the Pt-coated AFM conductive tip have a high work function as well, the measured current is essentially a hole current. As shown in FIGS. 6A-6B, the local dark current reduced after coating the PS layer, proving the function of PS in blocking holes. The uniform reduction of hole current across the whole mapping area indicates a conformal coating of PS on the perovskite film. The samples for photocurrent measurement had the structure of ITO/PTAA:F4-TCNQ/perovskite/ with or without PS/C$_{60}$. In the measurement, the c-AFM tips contacted $C_{60}$ surface to map the photocurrent of samples illuminated by a white light source with an intensity of 20 mW/cm$^2$. Since there is an electron-accepting layer, electrons can be collected by $C_{60}$ and conduct to the tip. FIG. 6C-6D show the photocurrent mapping results of the perovskite samples without or with the PS tunneling layer, respectively. The samples without a PS tunneling layer showed a photocurrent ranging from 0 pA to 0.8 pA with a very good reproducibility. After inserting a PS contact, the local photocurrent through most grains increased to >4 pA, directly proving the function of a PS tunneling layer in enhancing the photocurrent output. The function of the tunneling layer is also confirmed at a macroscopic level using the single-carrier devices with or without a PS tunneling layer. The electron-only devices have the structure of ITO/$C_{60}$/Perovskite/with or without PS/$C_{60}$/Al, and the hole-only devices have the structure of ITO/with or without PS/Perovskite/Au, which are shown in the insets of FIG. 6E-6F. The electron currents of the devices with or without a PS tunneling layer are almost comparable in the whole bias range, indicating the PS layer doesn't impede the electron transport. The hole-only device with a PS layer, however, has much smaller current than the device without PS layer, proving the function of blocking holes by the tunneling layer.

The tunneling layer spatially separates photo-generated electrons and holes at the perovskite/polymer interface by transporting electrons and blocking holes, which advantageously leads to the reduction of the carrier surface recombination. For verification, the carrier recombination lifetimes of devices with or without a PS contact were compared by transient photovoltage spectroscopy (TPV). As shown in the FIG. 4G, carrier recombination lifetime is longer in the device with a PS tunneling contact, compared with the control device (PCBM passivated) for the entire light intensity range. The carrier lifetime of the control device under one sun illumination is 0.5 µs which corresponds to the typical TPV lifetime of the PCBM passivated devices. The device with PS contact has a much longer carrier lifetime of 1.6 µs under one sun illumination, demonstrating the suppressed carrier recombination in devices with the tunneling contacts. The increased carrier lifetime extends the carrier diffusion length to increase device $J_{SC}$ and FF. Meanwhile, the suppressed carrier recombination is also beneficial to the increase of $V_{OC}$ as observed in the devices with tunneling contacts.

Inserting a tunneling layer between the perovskite and the electron transport layer significantly increases device performance by suppressing carrier recombination at the cathode contact. The tunneling layer can also serve as an encapsulation layer to prevent perovskite film from damage caused by water or moisture. This paradigm is simple because it doesn't need lattice matching between the buffer layer and perovskite. The low temperature solution process makes it compatible with many types of perovskite materials, and may be applied for anode contact as well. The freedom to choose any insulating layer for contact advantageously enables more device designs and manufacturing.

Device Fabrication Example

Methods of cleaning ITO glass, methylammonium iodide (MAI) synthesis, and preparing PTAA: F4-TCNQ solution are known. A spin coating process was conducted in a glovebox with oxygen level lower than 100 particle per million (PPM). The PTAA was doped by 1 wt % F4-TCNQ. The spun PTAA: F4-TCNQ films were thermally annealed at 100° C. for 20 min. The perovskite films were made by an interdiffusion method, where lead iodide (PbI$_2$) and methylammonium iodide (MAI) solutions were sequentially spun onto the substrates, followed by a thermal annealing driven diffusion process. The interdiffusion method referred to is described in U.S. patent application Ser. No. 14/576,878, filed Dec. 19, 2014, which is incorporated by reference herein. The concentration of PbI$_2$ and MAI was 650 mg/ml and 65 mg/ml, respectively. The spun films were annealed at 100° C. for 70 min on hotplate under the cover of a glass petri dish. 10 µL-30 µL DMF solvent was added at the edge of the petri dish during annealing process. After annealing, insulating materials were deposited on the perovskite by different methods. PS or the PS plastic foam were dissolved in dichlorobenzene (DCB) with concentrations from 0.02% (0.2 mg/mL) to 2.0% (20 mg/mL) and spin coated on top of perovskite at a speed of 6000 RPM. The films were annealed at 100° C. for 70 min; PVDF-TrFE was added into DCB: tetrahydrofuran (THF) mixture solvent (volume ratio from 10:1 to 5:1) and the solution was stirred and heated at 100° C. overnight. Then the saturated solution was filtered to remove the undissolved PVDF-TrFE. The saturated solution was spin coated on top of perovskite films at 6000 RPM and annealed at 100° C. for 70 min; Teflon was thermally evaporated with a deposition rate of 0.1 Å/s. Teflon thickness for the best devices was 2-5 nm. Fluoro silanes was purchased from Sigma Aldrich and spun coated on perovskite films with spin speed of 6000 RPM. For control device fabrication, PCBM was dissolved in DCB with a concentration of 2.0%. The solution was spin coated on perovskite films with a spin speed of 6000 RMP. Then the films were annealed at 100° C. for 70 min. After the deposition of insulating or PCBM layers, 20 nm thickness of $C_{60}$ was thermally evaporated with a deposition rate of 0.5 Å/s. The devices were finished by the evaporation of 7 nm 2,9-dimethyl-4,7-diphenyl-1,10-phenanthroline (BCP) and 100 nm aluminum electrode. The devices area was defined as the overlap of ITO and Al electrode. Slight variation of the device area was observed in devices from different batches. Optical microscopy was used to measure the active area accurately. Typical dimension of the device area was 2.0 mm×5.0 mm.

Photocurrent-Voltage Curve and EQE Measurements

The photocurrent-voltage curves of the devices were measured in the glovebox with oxygen level below 100 PPM. AM 1.5 G irradiation (100 mW cm$^{-2}$) with a xenon-lamp-based solar simulator (Oriel 67005, 150 W Solar Simulator) was used as the illumination source. A Schott visible-color glass-filtered (KG5 color-filtered) Si diode (Hamamatsu S1133) was used to calibrate the light intensity before photocurrent measurement. Keithley 2400 Source-Meter was used for recording the I-V measurement. Unless stated otherwise, the scanning direction for I-V measurement was from negative bias to positive bias. The voltage scanning rate was 0.1 V s$^{-1}$. The steady-state $J_{SC}$ was measured by recording device photo current under 0.94 V bias. Then steady-state PCE was obtained by multiplying the measured current with 0.94 V bias voltage. The EQE measurement was conducted in air without device encapsulation.

TPV Measurement

TPV measurement has been a well-established method to measure the device carrier recombination lifetime. In the measurement, the devices were stimulated by laser pulses (337 nm) to generate a small transient photovoltaic signal. A large resistance of 1 M Ohm was connected in serial with the devices so that the photo generated carriers could be effectively blocked to recombine in the devices. The transient voltage signal was recorded by a 1 GHz Agilent digital oscilloscope. The charge carrier recombination lifetime was derived by fitting voltage signal decay with a single exponential decay function. A Schott visible-color glass-filtered (KG5 color-filtered) Si diode (Hamamatsu S1133) was used to calibrate the light intensity.

c-AFM and TEM Measurements

The c-AFM studies were carried using a commercial AFM system (MFP-3D, Asylum Research, USA) equipped with conductive probes (PPP-EFM, Nanosensors). The photocurrent mapping was measured under 0 V bias and the dark current mapping was measured with a bias of 0.5 V. High resolution TEM analyses were carried out on a FEI OSIRIS microscope. The cross-sectional samples were prepared by using focused-ion-beam equipment (FEI Helios 660).

Water Stability Analysis

The water stability test was performed in air under room temperature. Purified water was used to prevent current leakage. The sample without further encapsulation was immersed in water and the photovoltaic output was recorded by a multimeter.

Amphiphilic Materials

In one embodiment, amphiphilic polymer material is applied directly on the formed perovskite layer to enhance its water resistance and thus device stability. In addition, amphiphilic polymer materials also hold great promise for surface modification, trap passivation, uniform film processing, and suppressing charge recombination in the perovskite devices such as solar cells, and consequently improve their efficiency and stability.

The hydrophilic terminal of the amphiphilic polymer with on-demand functional groups (such as —OH and —$NH^{3+}$) can firmly bind to the perovskite surface through hydrogen-bonding, and the hydrophobic tails on the top side of the films protect the perovskite layer by preventing water penetration. Moreover, even if a small amount of water molecules penetrate the hydrophobic barrier, the hydrophilic side of the amphiphilic polymer will temporarily hold the water in this layer, working as water reservoir, to stop its further penetration to the perovskite layer.

According to certain embodiments, the amphiphilic polymers have a formula R—X, where the R— group functions as the hydrophobic tail (examples include —$(CH_2)nCH_3$, —$(CH_2)nNH_2$, and —$(CH_2)nCF_3$), and the X— group is the hydrophilic head or terminal end. Amphiphilic polymers or block copolymers in which the hydrophilic terminal contains the functional groups (such as —OH, —$NH^3$) that have strong interaction with the perovskite can be used for perovskite surface functionalization. For example, due to the strong hydrogen-bonding interactions of the iodide from the perovskite with the hydroxyl (—OH) and the ammonium (—$NH^{3+}$) groups from the hydrophilic terminal of the amphiphilic polymer, the amphiphilic polymers strongly bind to the perovskite surface and the hydrophobic terminals face outside of the films to produce a hydrophobic coating which can further prevent the moisture penetrating into the perovskite film, as shown in FIG. 10. The following amphiphilic polymers may have the water resistant capability because of the above mechanism: Tween 20; Tween 40; Tween 60; Tween 80; D-α-Tocopherol polyethylene glycol 1000 succinate; PEG-PLA diblock copolymer; PEG-PLGA diblock copolymer; PEG-PCL diblock copolymer; PEG-PE diblock copolymer; PEG-PS diblock copolymer; PS-PAA amphiphilic diblock copolymer; Triton™ X-114. Where PEG=Poly(ethylene glycol); PLA=polylactide; PLGA=poly(L-lactide-co-glycolide); PCL=poly(ε-caprolactone); PE=Polyethylene; PS=Poly(styrene); PAA=poly(acrylic acid).

Example

Method: $MAPbI_3$ films were fabricated by a thermal annealing-induced interdiffusion method. The hole transport layer (HTL) material was spin coated at the speed of 4,000 r.p.m and then annealed at 100° C. for 10 min. $PbI_2$ beads (99.999% trace metals basis) were purchased from Sigma-Aldrich. After dissolved in N,N-Dimethylformamide (DMF) at temperature of 100° C., around 50 µl of hot $PbI_2$ precursor solution was quickly dropped onto the substrate and spin coated at the speed of 6,000 r.p.m. The as-fabricated $PbI_2$ films were dried and annealed at 90° C. for 10 min. To fabricate $MAPbI_3$ film, 630 mg $ml^{-1}$ $PbI_2$ DMF precursor solutions were used with 63 mg $ml^{-1}$ methylammonium iodide (MAI) 2-propanol precursor solution. The amphiphilic polymer solution was coated onto the perovskite substrate by spin coating at 6,000 r.p.m. for 35 s for the solution with different amphiphilic polymer concentration. The devices were finished by thermally evaporating C60 (20 nm), BCP (8 nm) and copper (80 nm) in sequential order.

Results

As shown in FIG. 11, the device with 0.1% Tween 20 polymer spin-coating has a short circuit current density ($J_{SC}$) of 23.53 mA/$cm^2$, an open circuit voltage ($V_{OC}$) of 0.99 V, a fill factor (FF) of 78%, and a PCE of 18.17%. FIG. 12A shows the photocurrent curves of perovskite devices with amphiphilic polymer L-α-Phosphatidylcholine (LP) functionalization and that of the control device with 20 nm [6,6]-phenyl-C70-butyric acid methyl ester (PCBM) to replace the insulating polymer layer. The control device has a short circuit current density ($J_{SC}$) of 17.91 mA/$cm^2$, an open circuit voltage ($V_{OC}$) of 1.05 V, a fill factor (FF) of 72%, and a PCE of 13.5%, which represent a typical performance of PCBM passivated perovskite devices. In contrast, the devices with L-α-Phosphatidylcholine (LP) modification exhibited an increased $J_{SC}$, $V_{OC}$, and FF. The devices with 5% L-α-Phosphatidylcholine (LP) modification showed higher $J_{SC}$ of 22.64 mA/cm2, VOC of 1.09 eV, a fill factor (FF) of 79.4%, and a PCE of 19.58%. Negligible photocurrent hysteresis was observed by changing the scanning directions, as shown in FIG. 12B. The absence of obvious photocurrent hysteresis is commonly observed in the devices because the charge traps at the film surface and grain boundaries are well passivated by L-α-Phosphatidylcholine (LP) layer. The calculated JSC from EQE in FIG. 12C reached 22.64 mA $cm^{-2}$, which is in good agreement with measured photocurrent. The device with L-α-Phosphatidylcholine (LP) modification showed a steady power output of 21.63 mA $cm^{-2}$ measured at 0.89 V during 100 s illumination (FIG. 12D). The quick turning on the photocurrent confirms the absence of large density charge traps. The performance of the device with L-α-Phosphatidylcholine (LP) modification is well agreed with the phenomenon of the passivation effect in silicon solar cells with the increased JSC and VOC, which derive from the reduced charge recombination in the surface and the grain boundaries. These result indicates that the charge recombination can be efficiently passivated by introduce an amphiphilic polymer layer inter grain boundaries and the film surface.

After self-assembling on the perovskite surface, the amphiphilic polymer can serve as a water-resistant layer to protect the perovskite film from water damage because of the exposed hydrophobic tail. The measured contact angle measured here represents the wetting capability of the different substrate surfaces to water. As expected, a hydrophobic surface with a contact angle of 99° was obtained. Encouragingly, the amphiphilic-polymer protected devices showed much better resistance to water damage. As shown by the photos in FIG. 13B, the perovskite device with Tween surface functionalization without further encapsulation showed no color change after it was soaked in water for 2 minutes, while the control device with 20 nm PCBM changed to yellow color after it was immersed in water for less than 5 seconds.

Cross-Linked and Doped Fullerene Layer

In certain embodiments, a cross-linked and doped fullerene material layer is included to enhance the stability and performance of perovskite photoactive devices. In one embodiment, cross-linkable molecules, which have hydrophobic function groups, are bonded onto fullerene (typically PCBM ([6,6]-phenyl-C61-butyric acid methyl ester)) material to convert the fullerene layer to be water-resistant. Additionally, methyl ammonia iodide (MAI) may be introduced in the fullerene layer for n-doping via anion-induced electron transfer (ET), leading to a dramatic increase in electrical conductivity, e.g., on the order of two orders of magnitude or greater. With a crosslinked and doped fullerene electron transport layer (ETL), the perovskite devices deliver a PCE up to 19.5% with a high fill factor of 80.6%. More encouragingly, the resulting devices possess good ambient stability and retain over 87% of their original efficiency after 30 days exposure to an ambient environment, well outperforming control devices based on conventional PCBM, which severely degrade within one week.

FIG. 14 illustrates a device design according to an embodiment. As indicated in FIG. 14, a planar p-i-n heterojunction perovskite device has a structure of transparent conductive electrodes (TCE)/hole transport layer (HTL)/perovskite/electron transport layer (ETL)/Top electrode. The cross-section SEM (scanning electron microscopy) image of the device can be found in FIG. 19. The perovskite (MAPbI$_3$) film was prepared by the two-step interdiffusion method as discussed above, where PbI$_2$ (lead iodide) and MAI were sequentially spun onto the substrate (e.g., PTAA substrate), followed by a solvent annealing process. A smooth and compact perovskite film was obtained with an average grain size larger than the thickness of the film. C60-SAM (C60-substituted benzoic acid self-assembled monolayer) was then spin-coated on top of the perovskite film and thermally annealed at 100° C. for 60 min. For crosslinking C60-SAM fullerene, 5-8 μL of trichloro(3,3,3-trifluoropropyl)silane was added at the edge of the petri dish during the thermal annealing process. The silane vapor was expected to penetrate in and crosslink with the C60-SAM layer. The crosslinked fullerene layer here acts not only as the electron transport and passivation layer, but also as a water-resistant layer to protect the perovskite film from exposure to moisture. The devices were completed by thermal evaporation of a buffer layer and a top electrode. More detailed information on film and device fabrication can be found in the experiment section, below.

FIG. 14 also illustrates how a crosslinked fullerene layer forms. Here a modified fullerene, C60-SAM, whose chemical structure is shown in the FIG. 14, was applied to form hydrogen bonding with the crosslinking agent. Trichloro(3,3,3-trifluoropropyl)silane was selected as the crosslinking agent, which generates three hydroxyl groups (—OH). The carboxyl group (—COOH) of the C60-SAM material forms a strong hydrogen bond with one of the hydroxyl group (—OH) provided by the silane material, and the silicon-oxygen (Si—O) bonds generated from silane-coupling reaction crosslinked the C60-SAM and silane molecules together. In addition, the trifluoromethyl groups (—CF3) from the silane material make the crosslinked fullerene layer more hydrophobic, which prevents the moisture and water from penetrating into the perovskite layer.

FTIR (Fourier transform infrared spectroscopy) transmission spectra (FIG. 15A) of fullerenes before and after silane modification were collected to verify the formation of crosslinked fullerene. As shown in FIG. 15A, new bands clearly appeared in the corresponding spectrum after crosslinking with silane agent. The strong vibration bands at 1262 and 1209 cm$^{-1}$ can be ascribed to the added —CF$_3$ groups to the fullerene layer. As illustrated in FIG. 14, one free —OH group of silane molecule forms a hydrogen bond with —COOH group of fullerene and the other two —OH groups are involved in the silane coupling reaction to form Si—O—Si bond. Though the hydrogen bonds of Si—OH . . . —COOH do not directly correspond to a vibration peak in the spectrum, they will affect the Si—OH and Si—O—Si vibration. Previous studies indicate the Si—O—Si vibration bands at 1185-1035 cm$^{-1}$ and isolated Si—OH groups show a sharp band at 3690 cm$^{-1}$. When the silane agent crosslinks with the fullerene layer via hydrogen bonding, the Si—O—Si vibration band moves to a lower frequency region of 1126-1002 cm$^{-1}$. In addition, a broad band at lower frequency region of 3400-3200 cm$^{-1}$ shown in FIG. 14 indicates the Si—OH groups are hydrogen bonded. These results well demonstrate that the fullerene layer was successfully crosslinked with the silane coupling agent through hydrogen bonding. SEM was used to examine the surface morphology of the fullerene film after silane functionalization. As shown in FIG. 20, some aggregates can be visualized on the pristine fullerene film without modification, while the silane-crosslinked fullerene film appear more compact and uniform. The aggregates found on the fullerene film may be caused by the intermolecular hydrogen bonding between —COOH groups during baking. When silane agent was introduced during thermal annealing, most of the hydrogen bonds are preferably formed between —OH groups of the silane molecule and —COOH groups of the fullerene due to the steric effect. Thus, driven by the silane crosslinking process, it is believed that the hydrogen bonding (—OH . . . —COOH) will align the fullerene molecules in order instead of forming dimers randomly and extend the intermolecular interaction for considerable distances, leading to pseudo-polymer type structures. Thus a more uniform and compact fullerene film will be produced, which was revealed by the SEM image (FIG. 20B). In a closely packed fullerene layer, the intermolecular interaction among neighboring fullerene molecules may also be formed through —COOH . . . —COOH hydrogen bonding over a longer distance. A contact-angle test was carried out to further study the water resistance behavior of the fullerene layers deposited on perovskite films before and after crosslinking. As shown in FIG. 15B, the contact angle of the fullerene film without crosslinking was as low as 46° and the color of the water droplet changed to yellow after 1-2 s, indicating the quick decomposition of MAPbI$_3$ to PbI$_2$. In contrast, the water resistance of the crosslinked fullerene film with hydrophobic —CF$_3$ function groups was significantly improved, showing a much larger contact angle of 86° (FIG. 15C) and a delayed film color change upon contacting water. These results confirmed the successful functionalization of the fullerene film by the silane and significantly enhanced water-resistivity.

Performance of the devices before and after crosslinking the fullerene layer was characterized. It is noted that a relatively thick fullerene layer may be needed to enhance the water resistivity, while the larger thickness and cross-linking process inevitably increases the device contact resistance at the cathode side. To improve the electron extraction ability of the crosslinked fullerene ETL, the fullerene is doped, e.g., a small amount of MAI is blended in the fullerene as an n-dopant. Effective n-doping of fullerenes by alkyl ammonium-based salts (n-dopants) was demonstrated in previous studies and enhanced conductivity was successfully achieved via the electron transfer between the anions of the n-dopants and fullerenes.

FIG. 16A shows crosslinking and doping effects of fullerene layer on the photocurrent density-voltage (J-V) curves of perovskite solar cells. A typical perovskite device with pristine C60-SAM fullerene layer had a short-circuit current density ($J_{SC}$) of 18.6 mA cm-2, an open-circuit voltage ($V_{OC}$) of 0.75 V, and a fill factor (FF) of 43%, yielding a very low PCE of 6.0% which may be explained by the bad morphology and low transport property of the C60-SAM layer. When the C60-SAM layer was crosslinked with silane coupling agent, the Voc and FF of the device increased dramatically to 1.05 V and 73.9%, respectively. The device employing crosslinked fullerene delivered an efficiency of 17.0%, which is comparable to the devices made with conventional PCBM. By introducing 10 wt % MAI into the crosslinked C60-SAM layer, the device showed a decent FF of 80.3%, resulting in a significantly enhanced PCE of 19.3%. All the photovoltaic performance parameters are summarized in Table 1, below.

TABLE 1

Photovoltaic performance of perovskite solar cells employing different ETLs. $R_S$ is the device series resistance derived from J-V curves:

| Sample | $J_{SC}$ (mA cm$^{-2}$) | $V_{OC}$ (V) | FF (%) | η (%) | $R_S$ (Ω cm$^2$) |
|---|---|---|---|---|---|
| Non-CL Fullerene | 18.55 | 0.75 | 43.0 | 5.98 | 8.19 |
| CL Fullerene | 21.95 | 1.05 | 73.9 | 17.03 | 3.72 |
| Doped CL Fullerene | 22.70 | 1.06 | 80.0 | 19.25 | 2.08 |

The performance of the perovskite devices based on crosslinked fullerene with different MAI doping levels are presented in FIG. 21 and detailed data are summarized in Table 2:

| Doping ratio (wt %) | $J_{SC}$ (mA cm$^{-2}$) | $V_{OC}$ (V) | FF (%) | η (%) |
|---|---|---|---|---|
| 0 | 21.95 | 1.05 | 73.9 | 17.03 |
| 5 | 22.46 | 1.06 | 78.5 | 18.69 |
| 10 | 22.7 | 1.06 | 80.0 | 19.25 |
| 20 | 22.10 | 1.04 | 78.9 | 18.13 |

The significant enhancement of FF can be explained by the reduced contact (or series) resistance ($R_S$) by doping the C60-SAM layer. The series resistance of devices with different ETLs was derived by fitting the slope of J-V curves. As shown in Table 1, the device $R_S$ was reduced from 8.19 Ωcm$^2$ to 3.72 Ωcm$^2$ simply by crosslinking the fullerene. $R_S$ was further reduced to 2.08 Ωcm$^2$ via appropriate doping of crosslinked fullerene. To verify the increased conductivity through crosslinking and doping, four-probe measurements directly on the fullerene films were carried out. Detailed methodology of the four-probe testing can be found in the experimental section. The obtained current-voltage characteristics were presented in FIG. 16B and the resistivity variation measured by four-probe method follows the same trend with that derived from J-V curves. To understand why the conductivity of fullerene layer was increased after crosslinking, we have to look at the parameters that determine the conductivity. The electrical conductivity of most solid organic materials was demonstrated to vary with the activation energy according to $$\sigma = \sigma_0 \exp(-E_a/kT) \quad (1)$$

where σ is the conductivity, $\sigma_0$ is a constant, $E_a$ is the activation energy, k is the Boltzmann constant, and T is the absolute temperature. The activation energy is the initial energy that the electric charges need to move inside the material. The extended intermolecular overlap through hydrogen bonding in the crosslinked fullerene layer increased the electron density of the aromatic system of the fullerene molecules, which produced a substantial decrease in $E_a$. Therefore, the conductivity of fullerene layer was significantly enhanced after crosslinking with silane coupling agent through hydrogen bonding. In addition, a more uniform and compact morphology may also contribute to the improved conductivity. The further enhanced conductivity through MAI doping can be explained by the anion-induced electron transfer between I$^-$ and fullerene. The statistics of FF distribution shown in FIG. 16C demonstrates the reliability and repeatability of the FF enhancement obtained by crosslinking and doping effect.

As shown in FIG. 16D, the optimized device based on crosslinked and doped fullerene (FIG. 16D) exhibited a $J_{SC}$ of 22.62 mA cm$^{-2}$, a $V_{OC}$ of 1.07 V, and a FF of 80.6%, yielding a PCE of 19.51%. No obvious photocurrent hysteresis was observed in the device made with crosslinked and doped fullerene by changing the sweeping direction (FIG. 16D), indicating the effectively reduced charge trap density by fullerene passivation. The integrated $J_{SC}$ from EQE (external quantum efficiency) spectrum shown in FIG. 16E reached 22.21 mA cm$^{-2}$, which is in good agreement with that from J-V measurement. The steady-state photocurrent measured at the maximum power point (0.93 V) is presented in FIG. 16F, which confirms the device performance parameters extracted from the J-V curve and verities the absence of photocurrent hysteresis in these devices.

To understand how doped CL fullerene boosts perovskite photovoltaic device performance, the recombination dynamics process was examined by impedance spectroscopy (IS) measurements, which are widely used in many photovoltaic systems, such as dye-sensitized solar cells, organic solar cells and perovskite solar cells. The measured impedance spectra of devices with non-CL fullerenes and doped CL fullerenes present different characteristics: as shown in FIG. 17A, the impedance spectra of devices with doped CL fullerenes have one semicircle indicating only one kind of recombination process dominates in these devices. This could be attributed to the surface trap assistant recombination process as the perovskite thin films have excellent crystallinity and low density of bulk defects. In sharp contrast, the impedance spectra of devices with non-CL fullerene show two semicircles associated with different time constants (FIG. 17B), indicating two recombination processes exist in these devices. Besides the surface recombination, the large density of traps in the non-CL fullerene could be the origin of the additional recombination process. As a result, an additional resistor-capacitor (RC) circuit was added into the equivalent circuit (inset of FIG. 17B) to separate the individual contribution of the two recombination processes. FIG. 17C shows the recombination lifetime of different recombination processes extracted from the IS modeling. For the devices with non-CL fullerenes, the shorter time constant (πf) was assigned to the recombination lifetime of the recombination process assisted by the traps in the non-CL fullerene as it is almost invariant to the applied bias and mainly determined by the trap density in the non-CL fullerene. The longer time constant (is) was assigned to the recombination lifetime of the surface recombination process. Apparently, the device with doped CL fullerenes has much longer recombination lifetime, demonstrating the effectiveness of this method to enhance the device performance.

The perovskite devices herein are expected be highly water-resistant due to the crosslinked fullerene employed. The stability of these devices was tested under extreme conditions. Water was dropped on top of the devices and then dried with a $N_2$ gun after exposing to water for a certain time. The device made of conventional PCBM severely degraded (FIG. 21A) after exposing to water within 5 s. In comparison, the performance of perovskite device employing crosslinked fullerene shown in FIG. 22B did not degrade at all after exposing to water for over 1 min, which confirmed the good water-resistivity of devices based on crosslinked fullerene. The time for water exposure was extended up to 4 min and no color change was observed indicating no decomposition of perovskite to $PbI_2$ occurred.

Thereafter, the stability of the perovskite devices was monitored using both conventional PCBM and self-developed crosslinked and doped fullerene as a function of storage time. All devices were stored without encapsulation in an ambient environment. As shown in FIG. 18A, in terms of the PCE of devices based on the conventional PCBM, the majority of its initial performance degraded dramatically in one week. While the perovskite devices employing crosslinked fullerene demonstrate encouraging stability and maintained over 87% of the original device performance for up to 30 days. The degradation of key photovoltaic parameters, that is, $J_{SC}$, $V_{OC}$ and FF versus storage time, is summarized in FIGS. 18B-18D. The original J-V curves showing the degradation can be found in supporting information (FIG. 23) for both types of perovskite devices stored at ambient environment for various numbers of days.

Methods

Film Formation and Device Fabrication.

Methylammonium iodide ($CH_3NH_3I$, MAI) was synthesized using the interdiffusion method. Poly(bis(4-phenyl)(2,4,6-trimethylphenyl)amine) (PTAA) film as HTL was first deposited on cleaned ITO substrates by spin coating 0.25 wt % PTAA solution at 6,000 r.p.m., and the as-prepared film was thermally annealed at 100° C. for 10 min [24]. The $MAPbI_3$ films were fabricated by solvent annealing-induced interdiffusion method. $PbI_2$ (dissolved in N,N-dimethylformamide (DMF)) was spin-coated on top of PTAA/ITO substrate at 6000 rpm for 35 s. Then MAI (dissolved in 2-propanol) was spin-coated on top of the dried $PbI_2$ layer at room temperature at 6000 rpm for 35 s. Afterwards the stacked precursor layers were solvent-annealed at 100° C. for 1 h. For the control devices using conventional phenyl-C61-butyric acid methyl ester (PCBM) as electron transport layers (ETLs), the PCBM (dissolved in 1,2-Dichlorobenzene (DCB), 2 wt %) was spin-coated on top of the perovskite layer at 6000 rpm for 35 s and annealed at 100° C. for 60 min. In order to develop crosslinked fullerene as stable and efficient ETLs, C60-substituted benzoic acid self-assembled monolayer (C60-SAM) material (1-Materials) was selected as the starting material. C60-SAM (2 wt %) was dissolved in a 1:1 volume ratio of THF (Tetrahydrofuran):DCB mixture solvent and the solution was then passed through a 0.2 μm PTFE filter. The C60-SAM solution was spin-coated on top of the perovskite films at 6000 rpm for 35 s. Subsequently all the films were put on a hotplate and covered by a glass petri dish. For the devices with crosslinked fullerene, 5-8 μL of trichloro(3,3,3-trifluoropropyl)silane (Sigma Aldrich) was added at the edge of the petri dish during the thermal annealing process (100° C. for 60 min). The silane vapor was expected to be able to penetrate into the C60-SAM layer and crosslink with C60-SAM. C60 (20 nm) and Bathocuproine (BCP) (8 nm) were then thermal evaporated as the buffer layers. The devices were completed by thermal evaporation of Cu (80 nm) as the top electrode. A small amount (5-20 wt %) of MAI (pre-dissolved in 2-propanol) was blended in the C60-SAM solution before spin-coating to dope it.

Film and Device Characterization.

The photocurrent (J)-voltage (V) curves of the devices were measured under AM 1.5 G irradiation (100 mW $cm^{-2}$) which was produced by an xenon-lamp based solar simulator (Oriel 67005, 150 W Solar Simulator). The light intensity was calibrated by a Schott visible-color glass-filtered (KG5 color-filtered) Si diode (Hamamatsu S1133) before photocurrent measurement. Keithley 2400 Source-Meter was used for recording the J-V measurements. The bias scanning rate was 0.1 V $s^{-1}$. The steady-state PCE was measured by recording the photocurrent at a bias voltage of 0.93 V. Impedance spectroscopy of the device was measured by the E4980A Precision LCR Meter from Agilent with homemade software under 1 sun illumination at room temperature. The resistivity measurements of C60-SAM films were performed using a four-point probe setup. Fullerene films before and after crosslinking were scratched off the substrates for FTIR (Fourier transform infrared spectroscopy) analysis. The FTIR spectra of fullerene powder were collected in the transmittance mode on the PerkinElmer IR spectrometer instrument in the 400-4000 $cm^{-1}$ region. The SEM images were taken from a Quanta 200 FEG environmental scanning electron microscope.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A photoactive device, comprising:
a first electrode layer;
a second electrode layer; wherein the first electrode layer comprises a first conductive material layer disposed on a first carrier transport layer;
a perovskite material disposed between the first electrode layer and the second electrode layer, wherein the first carrier transport layer is disposed between the first conductive material layer and the perovskite material; and
an insulating layer disposed between the first electrode layer and the perovskite material.

2. The photoactive device of claim 1, wherein the first electrode layer is a cathode layer.

3. The photoactive device of claim 1, wherein the first electrode layer is an anode layer.

4. The photoactive device of claim 1, wherein the insulating layer comprises an insulating dielectric material.

5. The photoactive device of claim 4, wherein the insulating dielectric material comprises an insulating polymer material.

6. The photoactive device of claim 5, wherein the insulating polymer material includes at least one polymer selected from the group consisting of polystyrene (PS), fluoro silane, polyvinylidenefluoride-trifluoroethylene (PVDF:TrFE), polymethyl methacrylate (PMMA), poly(dimethylsiloxane) (PDMS), polycarbonate (PC), polyvinylpyrrolidone (PVP), poly(vinyl alcohol) (PVA), poly(ethylene terephthalate) (PET), polyvinyl chloride (PVC), polypropylene (PP), and polytetrafluoroethylene (PTFE).

7. The photoactive device of claim 5, wherein the insulating polymer material includes an amphiphilic polymer selected from the group consisting of Tween 20, Tween 40, Tween 60, Tween 80, D-α-Tocopherol polyethylene glycol 1000 succinate, PEG-PLA diblock copolymer, PEG-PLGA diblock copolymer, PEG-PCL diblock copolymer, PEG-PE diblock copolymer, PEG-PS diblock copolymer, PS-PAA amphiphilic diblock copolymer, and Triton™ X-114, where PEG is Poly(ethylene glycol), PLA is polylactide, PLGA is poly(L-lactide-co-glycolide), PCL is poly(ε-caprolactone), PE is Polyethylene, PS is Poly(styrene), and PAA is poly (acrylic acid).

8. The photoactive device of claim 1, wherein the insulation layer is a first insulating layer and wherein the device further includes a second insulating polymer material disposed between the second electrode layer and the perovskite material.

9. The photoactive device of claim 8, wherein the second electrode layer comprises a second conductive material layer disposed on a second carrier transport layer, wherein the second carrier transport layer is disposed between the second conductive material layer and the perovskite material.

10. The photoactive device of claim 9, wherein each carrier transport layer comprises at least one material selected from the group consisting of BCP, a fullerene, and a fullerene-derivative.

11. The photoactive device of claim 10, wherein the fullerene includes one of $C_{60}$, $C_{70}$, $C_{71}$, $C_{76}$, $C_{78}$, $C_{80}$, $C_{82}$, $C_{84}$, and $C_{92}$, and wherein $C_{70}$ and $C_{84}$ derivatives include $PC_{70}BM$, $IC_{70}BA$, and $PC_{84}BM$.

12. The photoactive device of claim 11, wherein each carrier transport layer has a band gap of less than or equal to about 5.0 eV.

13. The photoactive device of claim 9, wherein each carrier transport layer comprises at least one $C_{60}$ derivative wherein the at least one $C_{60}$ derivative is selected from the group consisting of $C_{60}PCBM$, bis-adduct $C_{60}PCBM$, tris-adduct $C_{60}PCBM$, tetra-adduct $C_{60}PCBM$, penta-adduct $C_{60}PCBM$, hexa-adduct $C_{60}PCBM$, $C_{60}ThCBM$, bis-adduct $C_{60}ThCBM$, tris-adduct $C_{60}ThCBM$, tetra-adduct $C_{60}ThCBM$, penta-adduct $C_{60}ThCBM$, hexa-adduct $C_{60}ThCBM$, $C_{60}$ mono-indene adduct, $C_{60}$ bis-indene adduct, $C_{60}$ tris-indene adduct, $C_{60}$ tetra-indene adduct, $C_{60}$ penta-indene adduct, $C_{60}$ hexa-indene adduct, $C_{60}$ mono-quinodimethane adduct, $C_{60}$ bis-quinodimethane adduct, $C_{60}$ tris-quinodimethane adduct, $C_{60}$ tetra-quinodimethane adduct, $C_{60}$ penta-quinodimethane adduct, $C_{60}$ hexa-quinodimethane adduct, $C_{60}$ mono-(dimethyl acetylenedicarboxylate) adduct, $C_{60}$ bis-(dimethyl acetylenedicarboxylate) adduct, $C_{60}$ tris-(dimethyl acetylenedicarboxylate) adduct, $C_{60}$ tetra-(dimethyl acetylenedicarboxylate) adduct, $C_{60}$ penta-(dimethyl acetylenedicarboxylate) adduct, $C_{60}$ hexa-(dimethyl acetylenedicarboxylate) adduct.

14. The photoactive device of claim 1, wherein the perovskite material includes a perovskite having the formula $ABX_3$ or $A_2BX_4$, wherein A is methylammonium ($CH_3NH_3+$), Cs+ or formamidinium ($H_2NCHNH_2+$), B is a metal cation, and X is a halide anion, thiocyanate (SCN—) or mixture thereof.

15. The photoactive device of claim 14, wherein the metal cation is $Pb^{2+}$, $Sn^{2+}$, $Cu^{2+}$, or $Bi^{3+}$ and wherein the halide anion X comprises one of I—, Cl—, Br— or a mixture thereof.

16. The photoactive device of claim 1, wherein the perovskite material includes a single crystal perovskite.

17. The photoactive device of claim 1, wherein the insulating layer is hydrophobic.

18. The photoactive device of claim 1, wherein the perovskite material is a thin film.

19. The photoactive device of claim 1, wherein the insulating material has a thickness of between about 0.0001 nm and about 100 nm.

20. The photoactive device of claim 1, wherein the first electrode layer and the second electrode layer each comprise a conductive transparent or semi-transparent material selected from the group consisting of metal films, conductive polymers, carbon nanotubes, graphene, organic or inorganic transparent conducting films (TCFs), and transparent conducting oxides (TCOs).

21. The photoactive device of claim 1, wherein the perovskite material layer has a band gap of less than or equal to about 3.0 eV.

22. A photoactive device, comprising:
a first electrode layer;
a second electrode layer;
a perovskite material disposed between the first electrode layer and the second electrode layer; and a cross-linked fullerene layer disposed between the first electrode layer and the perovskite material; wherein the cross-linked fullerene layer includes a fullerene cross-linked with a silane.

23. The photoactive device of claim 22, wherein the fullerene comprises $C_{60}$-SAM and the silane comprises a structure having a formula:

$$F_3C\text{—}(CF_2)_m\text{—}(CH_2)_n\text{—}Si(X)_z(Y)_{3-z}$$

wherein:
 m is 0 to 16;
 n is 1 to 16;
 z is 1, 2, or 3;
 each X is independently selected from the group consisting of chloride, alkoxy, aryloxy, aralkoxy, hydroxyl, and halo; and
 each Y is independently selected from the group consisting of H, alkyl, aryl, and aralkyl.

24. The photoactive device of claim 22, wherein the fullerene layer is doped by an I-containing species.

25. The photoactive device of claim 24, wherein the I-containing species includes $CH_3NH_3I$.

26. A photoactive device, comprising:
 a first electrode layer;
 a second electrode layer;
 a perovskite material disposed between the first electrode layer and the second electrode layer; and
 a first insulating layer disposed between the first electrode layer and the perovskite material;
 a second insulating polymer material disposed between the second electrode layer and the perovskite material.

27. The photoactive device of claim 26, wherein the first electrode layer comprises a first conductive material layer disposed on a first carrier transport layer, wherein the first carrier transport layer is disposed between the first conductive material layer and the perovskite material, and wherein the second electrode layer comprises a second conductive material layer disposed on a second carrier transport layer, wherein the second carrier transport layer is disposed between the second conductive material layer and the perovskite material.

28. The photoactive device of claim 27, wherein each carrier transport layer comprises at least one material selected from the group consisting of BCP, a fullerene, and a fullerene-derivative.

29. A photoactive device, comprising:
 a first electrode layer;
 a second electrode layer;
 a perovskite material disposed between the first electrode layer and the second electrode layer; and
 an insulating layer disposed between the first electrode layer and the perovskite material; wherein the insulating layer is hydrophobic.

30. A photoactive device, comprising:
 a first electrode layer;
 a second electrode layer;
 a perovskite material disposed between the first electrode layer and the second electrode layer; and
 a cross-linked fullerene layer disposed between the first electrode layer and the perovskite material; wherein the fullerene layer is doped by an I-containing species; wherein the I-containing species includes $CH_3NH_3I$.

* * * * *